United States Patent [19]

Meisburger et al.

[11] Patent Number: 5,717,204
[45] Date of Patent: Feb. 10, 1998

[54] INSPECTING OPTICAL MASKS WITH ELECTRON BEAM MICROSCOPY

[75] Inventors: Dan Meisburger, San Jose; Alan D. Brodie, Palo Alto; Zhong-Wei Chen, San Jose; Jack Y. Jau, Fremont, all of Calif.

[73] Assignee: KLA Instruments Corporation, San Jose, Calif.

[21] Appl. No.: 606,854

[22] Filed: Feb. 26, 1996

Related U.S. Application Data

[63] Continuation of Ser. No. 252,763, Jun. 2, 1994, abandoned, which is a continuation-in-part of Ser. No. 889,460, May 27, 1992, abandoned.

[51] Int. Cl.⁶ .................................................. H01J 37/26
[52] U.S. Cl. ........................ 250/310; 250/306; 250/307; 250/397
[58] Field of Search .......................... 250/310, 306, 250/307, 492.1, 397

[56] References Cited

U.S. PATENT DOCUMENTS 5,502,306  3/1996  Meisburger et al. ............. 250/310
5,578,821  11/1996  Meisburger et al. ............. 250/310

Primary Examiner—Kiet T. Nguyen
Attorney, Agent, or Firm—Allston L. Jones

[57] ABSTRACT

An apparatus scans an electron beam across an optical phase shift mask and automatically inspects the mask to determine the features of the phase shift mask and classification of defects. An electron beam is directed at the surface of a mask for scanning that mask and detectors are provided to measure the secondary and backscattered charged particles from the surface of the mask. The mask is mounted on an x - y stage to provide it with at least one degree of freedom while the mask is being scanned by the electron beam. By analysis of various waveform features in each of the secondary and backscatter electron waveforms obtained from a phase shift mask, various physical features of the mask can be detected, as well as their size and position determined. The thickness of chromium layers can also be determined. In the inspection configuration, there is also a comparison technique for comparing the pattern on the substrate with a second pattern for error detection.

8 Claims, 20 Drawing Sheets

INSPECTING OPTICAL MASKS WITH ELECTRON BEAM MICROSCOPY

CROSS REFERENCE

This application is a continuation application of an application that is assigned to the same assignee that is entitled "INSPECTING OPTICAL MASKS WITH ELECTRON BEAM MICROSCOPY" having Ser. No. 08/252,763 filed on Jun. 2, 1994, now abandoned, which is a continuation-in-part application of an application entitled "ELECTRON BEAM INSPECTION SYSTEM AND METHOD" having Ser. No. 07/889,460 filed May 27, 1992, now abandoned.

This application is further related to another application that is assigned to the same assignee entitled "ELECTRON BEAM INSPECTION SYSTEM AND METHOD" having Ser. No. 08/214,377 filed on Mar. 17, 1994, U.S. Pat. No. 5,502,306, which is continuation of a now abandoned application having Ser. No. 07/710,351 filed on May 30, 1991.

FIELD OF THE INVENTION

This invention relates to the automatic inspection of substrates of various descriptions used in the making of micro-circuits and particularly the inspection with an electron beam of phase shift masks.

BACKGROUND OF THE INVENTION

A prerequisite of micro-circuit production with a reasonable yield is defect free masks and wafers to be used in the production process. Over the past 12 years a number of optical systems have been developed, and patented for the automatic inspection of optical masks and wafers. (See U.S. Pat. Nos. 4,247,203, 4,805,123, 4,618,938 and 4,845,558). These systems optically perform a comparison between two adjacent dice on a photomask, reticle or wafer. Similarly, technology has evolved to inspect a die against a CAD database (See U.S. Pat. No. 4,926,487). These optical systems are, however, limited to optical masks because defects on X-Ray masks may not be apparent in the visible or ultraviolet spectrum. Furthermore, optical inspection is limited in its resolution capability by the fundamental diffraction limit that of course also limits optical lithography. Even with phase shift mask techniques it is expected that line widths below 0.35 microns cannot be achieved with optical lithography techniques and that X-Ray lithography will dominate for line widths smaller than that.

Advances in optical lithography for the manufacturer of microcircuits have permitted increasingly smaller and smaller line widths. As an example, for a 256 megabyte DRAM, the line width on the wafer, is between 0.25 and 0.35 micrometers. For line widths of this size, phase shift masks are used in the manufacture of the semiconductor device. These masks typically have a quartz base, a patterned chromium layer on the surface thereof, and phase shift wells selectively etched into the substrate. A phase shift may also be produced by patterned, optically transparent, material placed on the quartz substrate or the chromium layer of the phase shift mask.

The inspection of masks that are used to produce very fine line widths on the semiconductor to be produced, such as the type of masks referred to above, requires the detection of defects in the patterned chromium layer, as well as the measurement of the depth of trenches or wells, both wanted and unwanted, in the quartz. Additionally, it is necessary to be able to detect the presence or absence of defects in the quartz which is also referred to in the art as the phase shift material.

Typically, phase shift masks, because they are optically transmissive and designed for use optically, are inspected using optical techniques. Those optical inspection techniques have proven to be frequently inadequate for the masks that can produce newer fine-line patterns because of the limitations in resolution of the prior art optical inspection methods.

The co-pending application from which this application is a continuation-in-part application, as identified above, describes an electron microscope inspection system and the use of that system to inspect primarily x-ray masks and wafers. One shortcoming of electron scanning in those systems in the past is that they did not measure the optical phase shift related to the depth of a well or trench in a known material of the mask or wafer.

SUMMARY OF THE INVENTION

In accordance with the preferred embodiments of the present invention, there is disclosed a method and apparatus for a charged particle scanning system and an automatic inspection system to inspect optical phase shift masks using an electron beam delivered in a charged beam column. In one embodiment there is an automatic system and method for the automatic inspection of an optical phase shift mask by delivering and scanning a charged particle beam on the surface of the mask, detecting backscattered and secondary electrons emanating from the top surfaces of the mask, and processing those waveforms to determine the features of the mask and to make a determination as to the presence or absence of defects by comparison to an other similar pattern on a mask or a data base for production of the mask under inspection.

In the present invention, a method and apparatus is disclosed to measure the depth of wells in phase shift masks used to produce the desired phase shift, and thereby detect any error in phase shift that would be produced if that mask were used.

The present invention also allows for the detection of either the presence or the absence of the phase shift material, and can determine the thickness of that material in a phase shift mask.

DESCRIPTION OF THE PREFERRED EMBODIMENT

SYSTEM OVERVIEW

Figure 1:
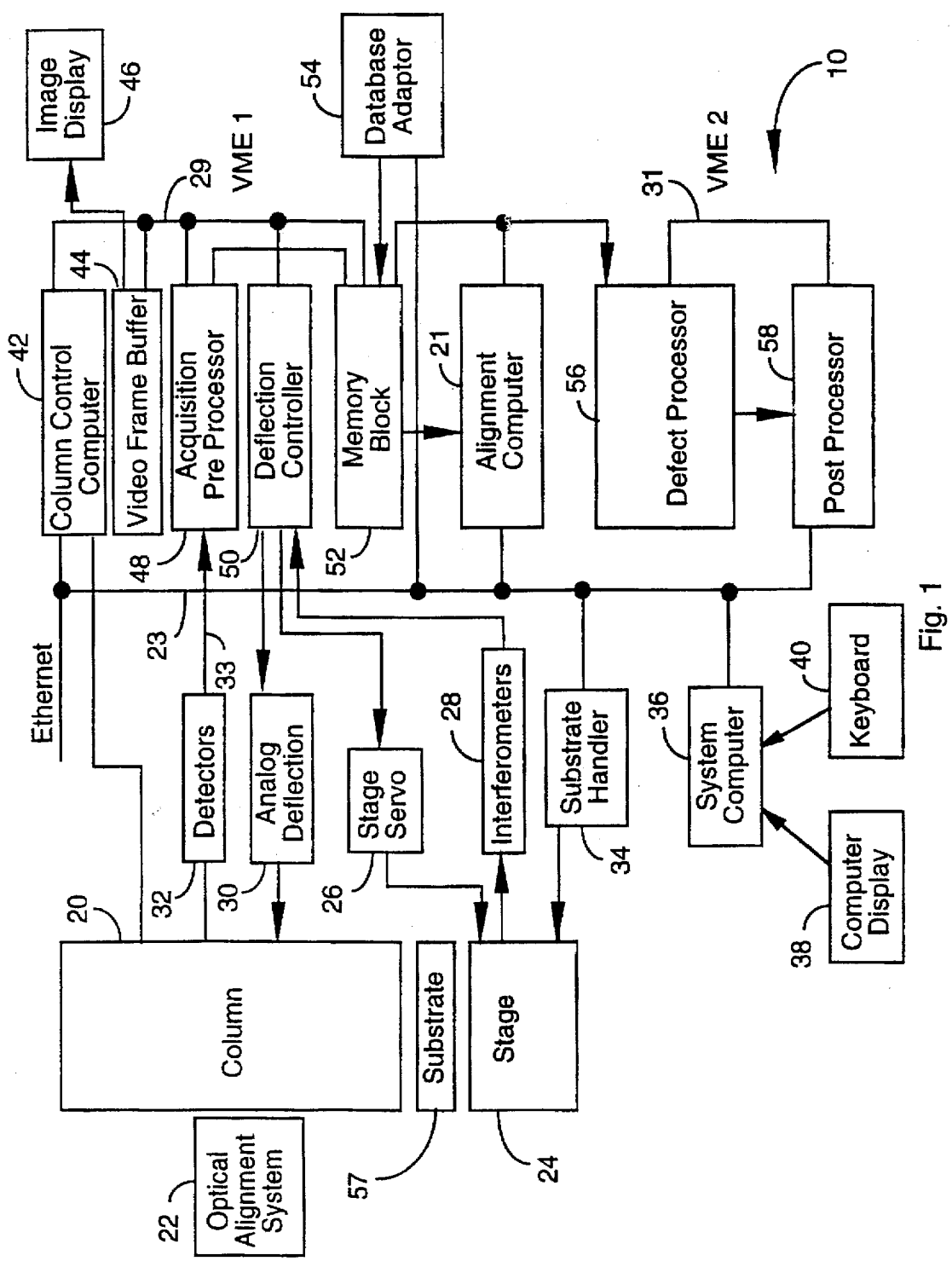
FIG. 1 is an over-all block diagram of the system of the present invention.

The present invention provides an economically viable, automatic charged particle beam inspection system and method for the inspection of wafers, X-ray masks and similar substrates in a production environment. While it is expected that the predominant use of the present invention will be for the inspection of wafers, optical masks, X-ray masks, electron-beam-proximity masks and stencil masks, the techniques disclosed here are applicable to the high speed electron beam imaging of any material, and furthermore are useful for electron beam writing to expose photoresist material in the manufacture of masks or wafers.

There are two basic modes of operation, depending upon whether the substrate is insulating or conducting. A "high voltage mode" is primarily intended for the inspection of conducting or conductively coated X-ray masks, E-beam proximity stencil masks or wafer prints. In this mode, a high voltage scanning beam can be used because the surface cannot charge. A "low voltage mode" is primarily intended for the inspection of in-process wafers that include layers of non-conducting materials and of optical masks. In this mode, the use of a lower voltage scanning beam minimizes both charging and damage effects. Except for these differences, both modes use similar high speed strategies for finding and classifying defects.

The requirement of economic viability excludes present scanning electron microscopes because these devices have scanning speeds that are too slow and also require operator skills that exceed the skills of much of the available work force.

A novel feature of the present invention is its ability to not only detect various types of defects but to differentiate between them. By virtue of the present invention being able to simultaneously detect and differentiate between backscattered, transmitted and secondary electrons in "high voltage mode", defects can be classified readily. As an example, a defect detected by only the transmission detector on an X-ray mask is probably a void in the absorptive material. A defect detected by the secondary electron detector but not by the back-scattered electron detector is most likely an organic particle, and a defect detected by the back-scatter electron detector is very likely a contaminant of a high atomic weight. Because some types of defects, such as organic contaminants on X-ray masks, do not print on the wafer, the ability to differentiate between various types of defects is a significant advantage of the present invention. The present invention therefore permits not only the detection of defects but the ability to classify them.

The system also employs a number of techniques to make it suitable for semiconductor manufacturing operations. To avoid contaminants being stirred up, the pump down and repressurization speeds are limited and the gas flow is kept laminar. In order to save time, these operations are done concurrently with the scanning of another sample. To further reduce unproductive time, six field emission sources are mounted on a turret. Finally, all the major adjustments of the electron beam, usually handled by an operator, are done by a computer, thereby permitting the use of the system by someone of relatively low skill level.

In FIG. 1 there is an overall block diagram of an inspection system 10 of the present invention. In system 10 an automatic inspection apparatus of X-ray masks, wafers, and other substrates, is shown which uses a scanning electron microscope as its sensor.

The inspection system has two modes of operation: die-to-die and die-to-database. In both modes, defects are detected by comparing an electron beam image derived from scanning the substrate against a standard. In die-to-die inspection, signals from two dice of the same substrate are compared with each other, while in die-to-database inspection the signal from one die derived from the electron microscope is compared with a signal that is derived from the database which typically is the one that was used to make the die.

Substrate 57 to be inspected is held in a holder which is automatically placed beneath electron beam column 20 on x-y stage 24 by substrate handler 34. This is accomplished by commanding substrate handler 34 by system computer 36 to remove the substrate 57 of interest from a cassette with the flat 59 or notch (see FIGS. 2 and 3a) on substrate 57 being detected automatically to properly orient the substrate 57 in handler 34. The substrate is then loaded under column 20. Next, the operator visually observes the mask through optical alignment system 22 to locate the alignment points on the substrate (these may be any operator selected features on the substrate) to ensure that the x-directional motion of the stage is substantially parallel to the x-axis of the care area of the substrate patterns, i.e., the area of interest for the inspection. That completes the coarse alignment.

Fine alignment is subsequently achieved by the operator scanning the substrate with the electron beam and observing the image on image display 46. All alignment data is then stored in alignment computer 21 which works in cooperation with system computer 36 for calculation of the actual combined x and y motions necessary to scan the die along its x and y axes so that no further operator alignment action is required for inspections of the same type of substrates. Once the substrate is properly aligned, the inspection process is initiated.

Column 20 and its optical alignment system 22, analog deflection circuit 30 and detectors 32 (as described more completely below) then direct an electron beam at substrate surface 57 and detect the secondary electrons, the backscattered electrons and those which pass through substrate 57. That operation and the data collection from that exposure is performed by column control computer 42, video frame buffer 44, acquisition pre-processor 48, deflection controller 50, memory block 52. VME bus, VME1, 29, serves as the communication link between the subsystems.

The position and movement of stage 24 during the inspection of substrate 57 is controlled by stage servo 26 and interferometers 28 under the control of deflection controller 50 and alignment computer 21.

When the comparison mode is die-to-database, database adaptor 54 in communication with memory block 52 is used as a source of the signal that is equivalent to the expected die format.

The actual defect processing is performed on the data in memory block 52 by defect processor 56 in conjunction with post processor 58, with the communication between these blocks being via bus VME2, 31.

The overall operation of the system is performed by system computer 36, user keyboard 40 and computer display 38 in communication with the other blocks via a data bus 23 which may be similar to an Ethernet bus. (Ethernet is a trademark of Xerox Corp.)

Figure 2:
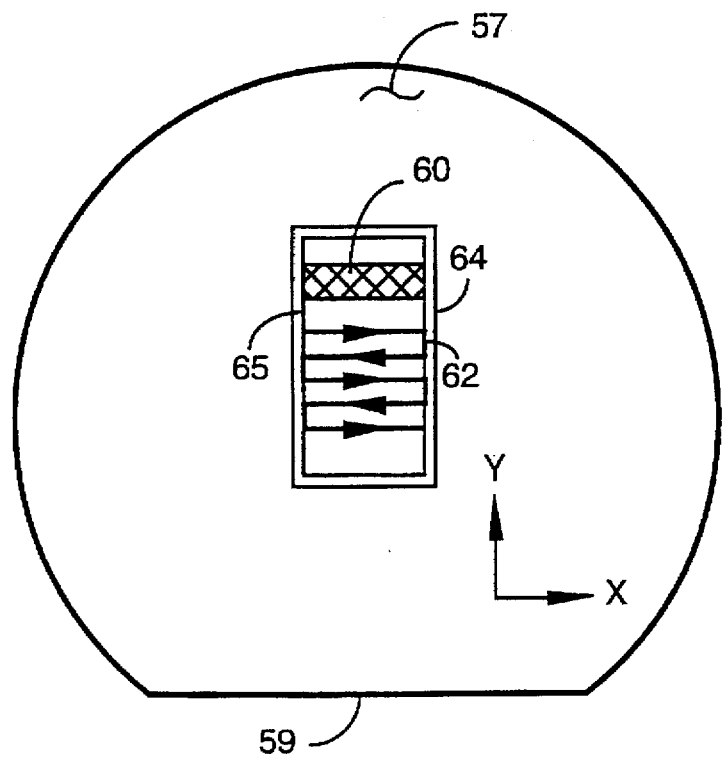
FIG. 2 is a graphical representation of the scan pattern used by the present invention for die-to-database inspection.

Next, FIG. 2 illustrates the scan pattern of the present invention for the inspection in the die-to-database mode. Here a single die 64 is shown on substrate 57. Within die 64 there is a care area 65, or area of significance, that is to be inspected. This area is the area where the critical information is recorded on substrate 57. During the inspection of die 64 the effective scanning motion in the x-direction is provided by moving stage 24 and the effective motion in the y-direction is provided by deflection of the electron beam within each swath which is as wide as the illustrative swath 60. When the inspection swath reaches the right side of die 64, stage 24 is moved in the y direction less than a full swath width. Since the x-y coordinate system of substrate 57 may not be aligned exactly with the x-y coordinates of stage 24 and column 20, the actual movement of stage 24 and the deflection of the beam of column 20 will each have an x and y component during the scanning of a die 64.

To fully inspect the care area 65, the inspection is performed in a back and forth pattern 62 with each of the passes illustrated by pattern 62 being a swath that slightly overlaps the adjacent swath with the swath having a width of that of illustrative swath 60.

In the die-to-database mode the signal corresponding to each swath is compared with the simulated signal derived from database adaptor 54 for a corresponding swath of a perfect die. This procedure is repeated for each of the swaths in care area 65 being inspected before the next die is inspected.

Figure 3A:
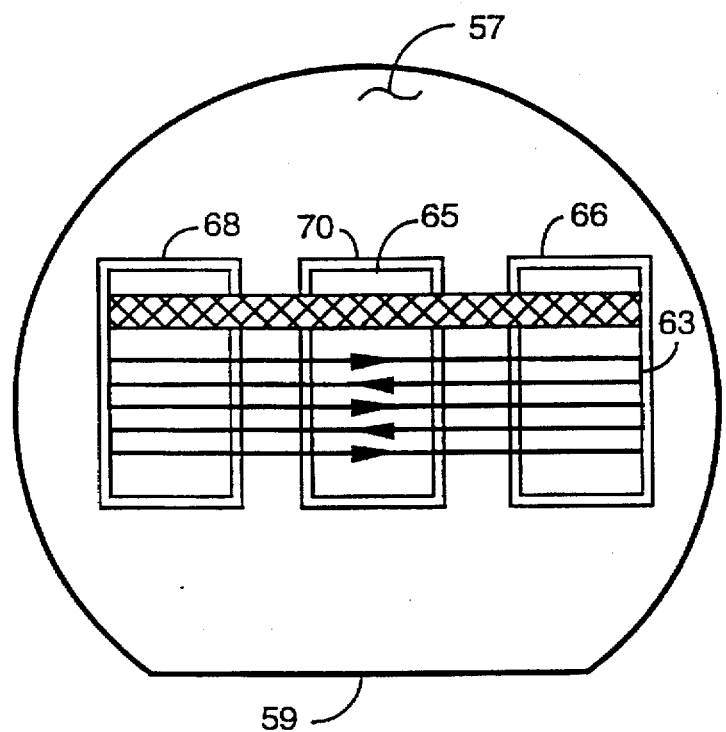
FIG. 3a is a graphical representation of the scan pattern used by the present invention for die-to-die inspection.

FIG. 3a illustrates the scan pattern for die-to-die inspection, and for purposes of illustration, substrate 57 is shown with dies 68, 70 and 66, in that order from left to right. In this inspection mode, similar to that shown in FIG. 2, a back and forth scan pattern 63 is used. However since the inspection mode here is die-to-die, stage 24 is not advanced in the y direction until all three of the dice (as per this illustration) are traversed in the x direction along each of the swaths.

In this mode of comparison, the data of the first pass of die 68 is stored in memory block 52 for comparison with the data from the first pass of die 70 as it is made. At the same time that the comparison between dice 68 and 70 is being made, the data from die 70 is stored in memory block 52 for comparison with the data from the first pass of die 66. Then on the second, or return, pass the order is reversed with the data from the second pass of die 66 being stored for comparison with the data from die 70, which is then stored for comparison with the second pass of die 68. This pattern of inspection and comparison is then repeated as many times as necessary to inspect all of the care areas of substrate 57.

Sometimes it is necessary to obtain images using a multiple scan integration technique, where each pixel is exposed for a longer time interval. Conventional scanning microscopes usually use slow scan techniques that extend the dwell time before the beam moves to an adjacent pixel. In this system, substrate heating and charging considerations make it undesirable to reduce the rate at which pixels are recorded.

Sometimes it is necessary to integrate multiple scans to obtain images with sufficient contrast or to improve the image signal-to-noise ratio. The signal-to-noise ratio is improved by averaging, for each pixel, the signal values from a number of scans of the same position on the substrate. The image contrast in "low voltage mode," which will be described in detail in the ELECTRON OPTICS section of this system overview, can also be improved by scanning the substrate nearby between the times that the electron beam revisits the site of a particular pixel on the substrate. The contrast improvement in low voltage inspection of nonconductive substrates, as shall be explained in the ELECTRON OPTICS section, is accomplished by permitting secondary electrons, generated when nearby regions are scanned, to replace electrons at the particular pixel site between times the beam revisits. In addition, for some temperature-sensitive substrate materials, it is desirable to have a time interval between beam scans of a pixel site in order to permit the heat deposited by the beam to dissipate.

Figure 3B:
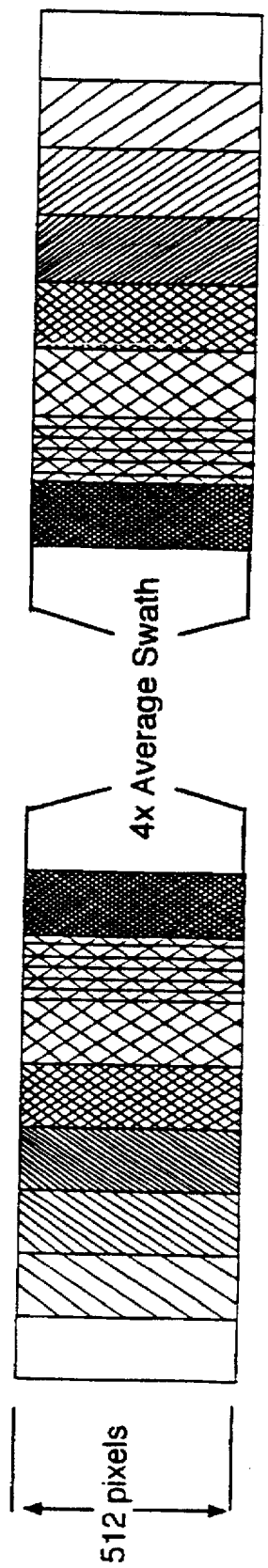
FIG. 3b is a graphical representation of the multiple frame scan integration technique of the present invention used to acquire images that are averaged over several scan fields.

FIG. 3b is a graphical representation of an example of the scanning method employed by the present invention. The figure shows how a region is scanned four times for signal averaging by deflection of the beam to cover a series of 512-by-m pixel rectangles. The center of each successive rectangle is shifted by m/2 pixels along the direction of stage motion.

FIG. 3b shows an example of the overlapping frame scan technique employed in the present invention for signal averaging, contrast improvement, and heat dissipation. In the example shown, each pixel is scanned four times. Each scan line is 512 pixels long in the Y-direction. For overlapping frame scans, a series of m side-by-side lines, numbered 1 to m is scanned on the substrate. The X-direction spacing between lines is set equal to the pixel size and the lines have successively larger X coordinates.

Figure 3C:
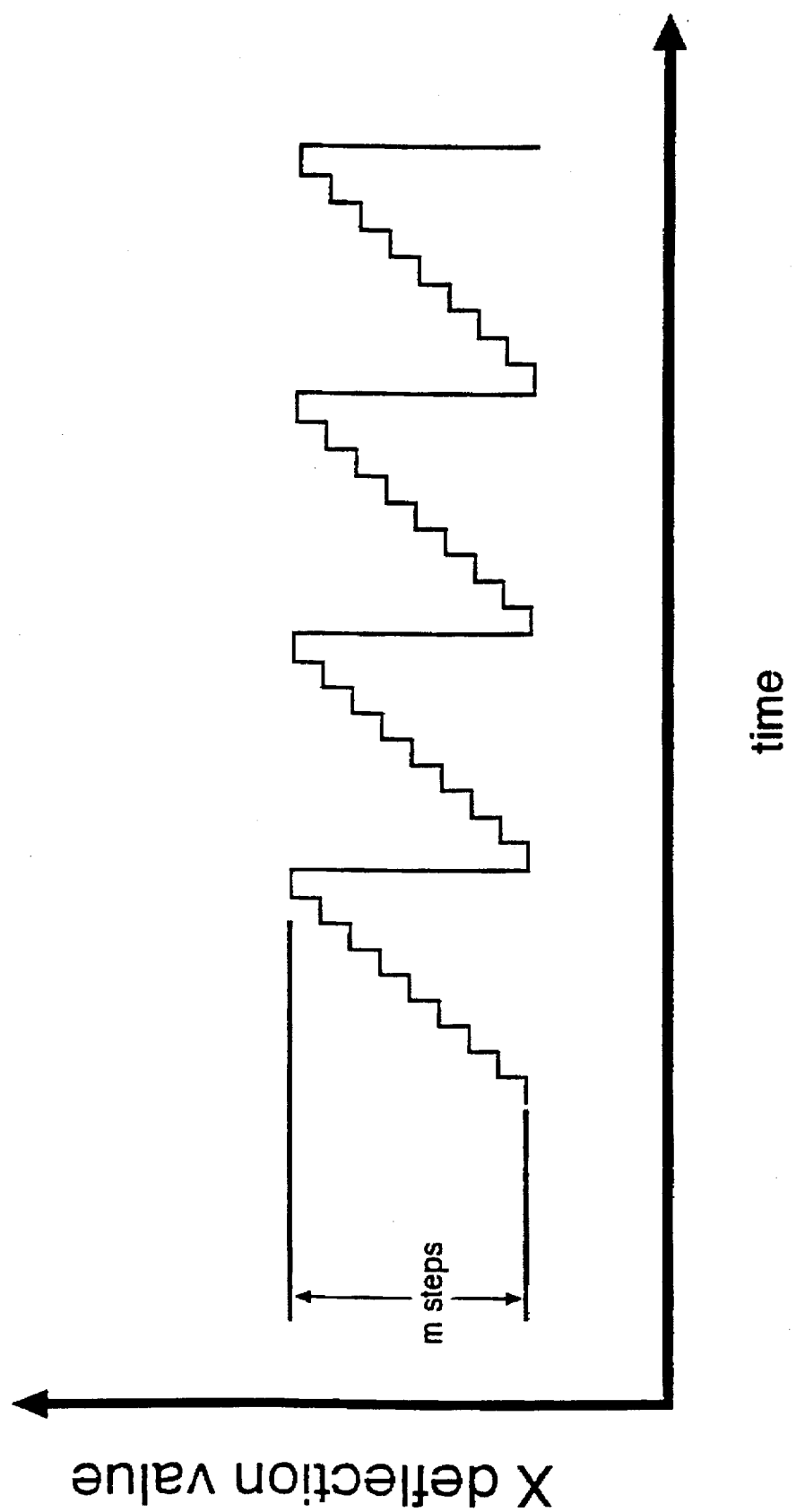
FIG. 3c is a graphical representation of the nominal X-deflection value for the beam as a function of time during the scan depicted in FIG. 3b.

FIG. 3c is a graphical representation of the nominal X-deflection value for the beam as a function of time during the scan depicted in FIG. 3b. The horizontal direction is the time axis, the vertical direction is the X position.

FIG. 3c shows the staircase-like output of the X deflection system used to deflect the beam. After m lines have been scanned, the scan is retraced in the X direction, as shown in FIG. 3c. The X velocity of the stage carrying the substrate under the deflection system is adjusted so that when the beam retraces in the X direction, the position of next scan line coincides with line number (m/4+1) of the first m lines. In the example of four rescans for this description, the stage moves the substrate in the X-direction a distance of m pixel widths in the same time that the beam scans four successive 512-by-m rectangles.

Figure 3D:
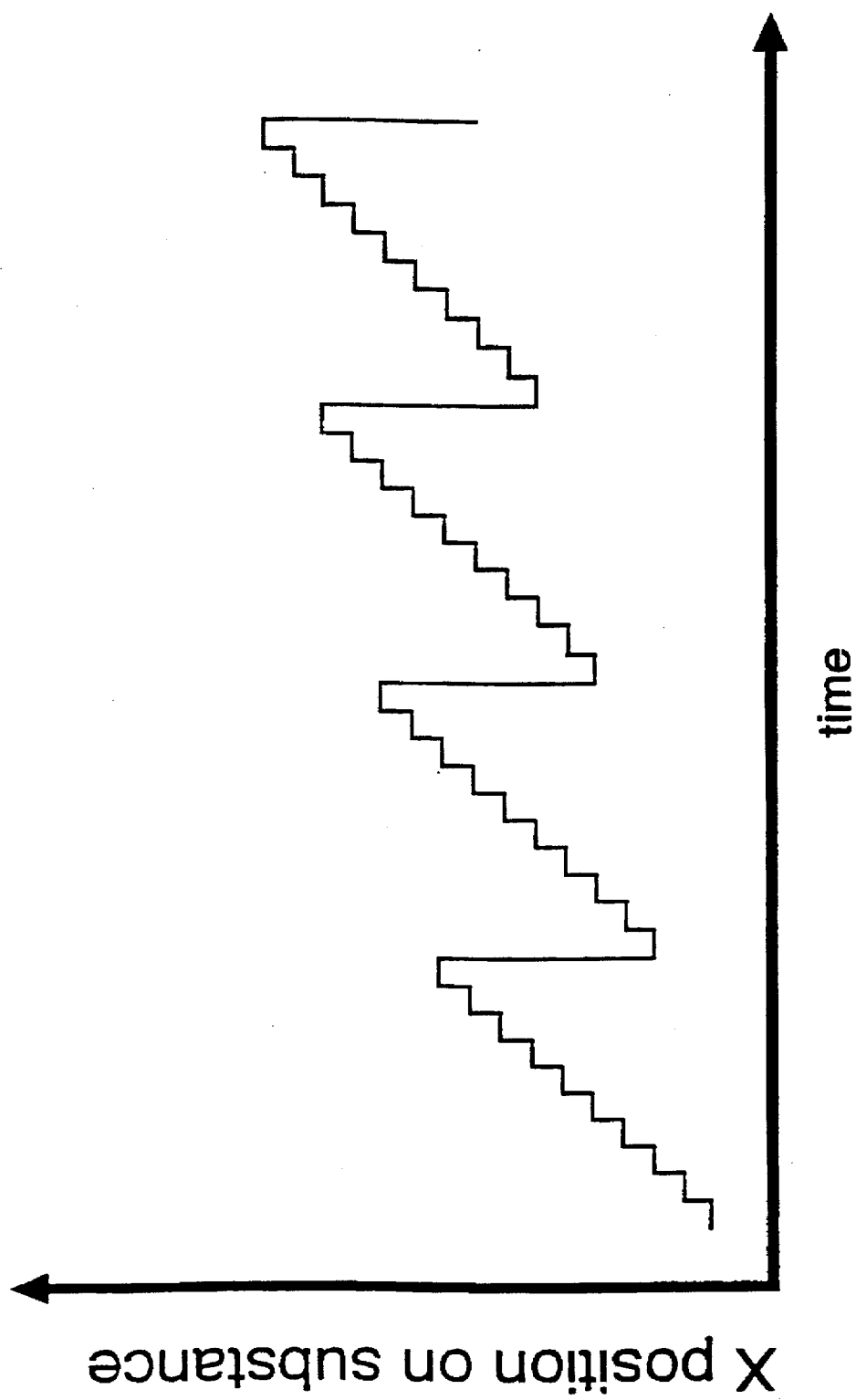
FIG. 3d is a graphical representation of the X-coordinate of the beam on the substrate as a function of time during the scan depicted in FIG. 3b.

FIG. 3d is a graphical representation of the X-coordinate of the beam on the substrate as a function of time during the scan depicted in FIG. 3b. The horizontal direction is the time axis, the vertical direction is the X position of the beam.

FIG. 3d shows the X-coordinate of each successive scan line on the substrate as a function of time. What is shown is that the combination of the stage moving the substrate under the deflection system and the deflection system moving the scan lines in back and forth in the X direction in the deflection field results in the beam scanning the position of each line on the substrate four times. By recording image data in memory block 52 and averaging from appropriate memory addresses, average data can be presented to the defect processor 56 and to alignment computer 21. Although we have used four as an example of the number of averages in this description, the number of scans combined in practice and the number of lines-per-frame m are chosen to produce the best combination of noise reduction, contrast enhancement, and inspection throughput.

The y direction scan (perpendicular to stage motion) is the same as that used for single pass imaging. Here the scan advances one pixel D per exposure interval t. For single pass imaging, using a 512 pixel wide swath, the stage velocity D/512t is chosen so that the stage also advances one pixel during each scan. During multipass imaging, the scanning beam as seen from the substrate must also advance at this rate of D/512t microns/sec in order to record square pixels. To record images with n pixel exposures per pass, the stage advances more slowly at a rate of less than D/512nt, and a stepwise scan in the direction of stage motion is applied, so as to advance the beam an additional (1-1/n) D microns during scan time 512t. After a variable number m steps, the x scan is retraced. Thus the scan trajectory is a 512×(1-1/n)m rectangular frame. When viewed from the substrate surface, one sees the overlapping frame pattern shown in FIG. 3b. The time interval between multiple exposures of each image pixel is 512mt. So long as m is chosen greater than n, one can independently vary both the number and repetition rate of pixel rescans. By recording image data in memory block 52, and averaging data from appropriate addresses, the averaged data can be presented to the defect processor 56 as though it had been recorded in a single, slower pass. The advantage of this technique is the parameters can be adjusted so that the substrate has an optimum time to reach equilibrium between pixel exposures.

In more detail then, referring again to FIG. 3a, using the die-to-die mode for illustration, as the electron beam scans a swath of dice 68 and 70, signals 33 from the three types of detectors are transmitted to acquisition pre-processor 48 where they are converted to digital signals for storage in memory block 52. Data from dice 68 and 70 are simultaneously transmitted to defect processor 56 where any significant discrepancy between the two data streams is then designated as a defect. The accumulation of the defect data from the defect processor 56 is then transferred and consolidated in post-processor 58. It is the post-processor that determines the size and various characteristics of the defects and makes that information available to system computer 36 via bus 23.

In the die-to-database inspection mode, system 10 operates similarly except that memory block 52 receives data from only one die and the reference data for comparison in defect processor 56 is provided by database adaptor 54.

After the entire substrate has been inspected, a list of defects, together with their locations, is displayed on computer display 38, and the operator can then initiate a defect review via keyboard 40. In response to this command, system 10 locates and scans the neighborhood of each defect and displays the image to the operator on image display 46.

SCANNING OPTICS

The much greater, by a factor of almost 100 higher, imaging speed is achieved through the combination of some key elements and the special design of column 20. The first and foremost prerequisite in achieving a higher imaging speed is a much higher beam current, since signal to noise considerations are one of the fundamental limitations in the speed of scanning. In the present invention, a high brightness thermal field emission source is used to produce a very high angular beam intensity and a very high resultant beam current. However, a high electron density results in mutual coulomb repulsion. To combat this, a high electric field is introduced in the vicinity of the cathode, and the beam diameter is also quickly enlarged. In the column there are also no electron cross-overs which would increase the charge density in that area and a large numerical aperture is employed, to again minimize coulomb repulsion problems.

A requirement for scanning the mask at a high rate such as 100 Megapixels per second, is for the detector to be able to temporally separate the secondary (return) electrons originating from two successively scanned pixels. This implies the need for a very short spread in arrival time in comparison with the dwell time on each pixel. To minimize the time of arrival spread from each pixel, the electrons are accelerated soon after leaving the target. The resultant arrival time spread at the detector is consequently held to about 1 nanosecond. To further minimize the arrival time spread, reverse biased high frequency Shottky barrier detectors, one for each type of electron to be detected, are employed (Shottky detectors are included here for illustrative purposes, however, there are other types of semiconductor detectors that could also be used).

ELECTRON OPTICS

The electron optical subsystem is functionally similar to a scanning electron microscope. It provides the scanned electron beam probe and secondary, transmission and back-scattered electron detection elements necessary to form images of the substrate surface. During inspection, the electron beam is scanned in one direction while the stage is moved in the perpendicular direction. Either low voltage secondary electrons, or high energy transmitted electrons or back-scattered electrons are used to form a video signal that is digitized and stored in the form of long, narrow swath images. As well as being unique in its application for automated defect detection at high resolution, the novelty of this optics system lies in the combination of new and prior art technology used to obtain high speed, low noise images at the resolution necessary for inspection.

The beam is typically scanned over a field of 512 pixels (18-100 micrometer width) using a very fast 5 microseconds period sawtooth scan. The deflection is largely free of distortion and is substantially perpendicular to the surface, so that the imaging characteristics are uniform over the scan field.

Detection is highly efficient so that nearly all of the secondary electrons generated by each electron in the probe are used to form the image. The bandwidth of the detection system is comparable to the pixel rate, due to the short transit time effects. Extraction of secondary electrons is coaxial so that edge features are imaged identically regardless of their orientation upon the substrate.

Figure 4:
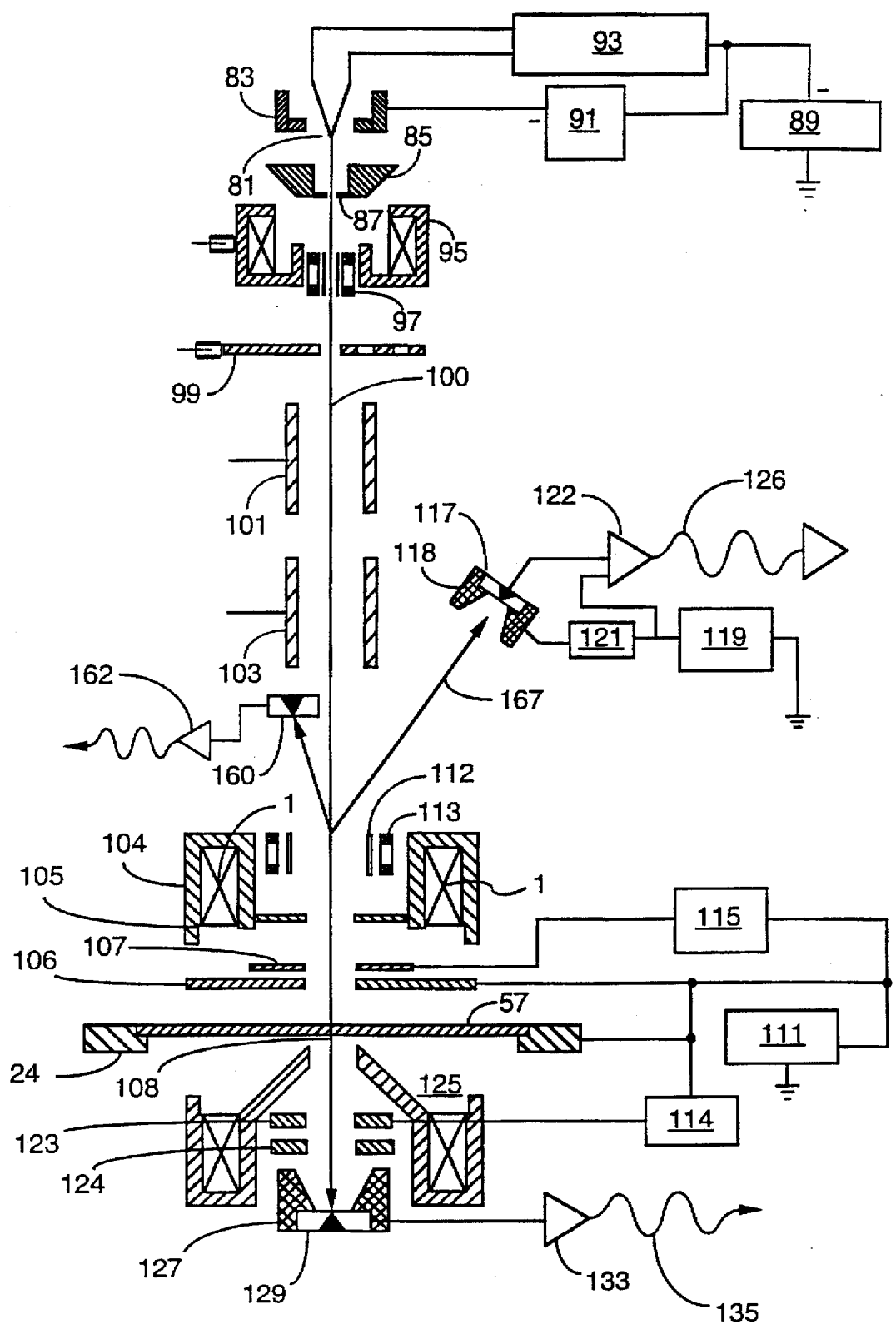
FIG. 4 is a schematic representation that shows the functional elements of the electron optical column and collection system.

FIG. 4 shows the elements of the optical subsystem and some of the associated power supplies necessary for understanding its function. The electron gun consists of a thermal field emission cathode 81, an emission control electrode 83, and an anode 85 having an anode aperture 87. Cathode 81 is held at a voltage of −20 KeV by power supply 89. Emission current, which depends upon the electric field strength at the surface of cathode 81, is controlled by the voltage on electrode 83 via bias supply 91, which is negative with respect to the voltage on cathode 81. Cathode 81 is heated by current supply 93. A magnetic condenser lens 95 near cathode 81 is used to collimate the electron beam. An upper deflection system 97 is used for alignment, stigmation and blanking. The optics are further apertured by beam limiting aperture 99 consisting of several holes. The beam 100 is deflected by a pair of electrostatic pre-lens deflectors 101 and 103, causing the beam to rock around a point above the objective lens 104. Objective lens 104 consists of lower pole piece 106, intermediate electrode 107 and upper pole piece 105. In the high voltage mode of operation only the magnetic elements 105, 106 of the objective lens are used to focus the probe. The beam is eventually scanned telecentrically over substrate 57. The approximately parallel beam is refocussed by the objective lens 104, forming a 1× magnified image of the source that illuminates substrate 57.

In the high voltage secondary electron imaging mode, secondary electrons are extracted up through the objective lens 104. Stage 24, substrate 57 and lower lens pole piece 106 are floated a few hundred volts negative by power supply 111 so that secondary electrons are accelerated to this energy before passing through deflectors 112 and 113. The intermediate electrode 107 is biased positive with respect to the stage via supply 115, and is used to accelerate the electrons as soon as they leave the substrate and to aid in the efficient collection of secondary electrons that emanate from depressed areas on the substrate. This combination of a floating stage 24 and an intermediate electrode 107 virtually eliminate any spread in electron arrival times at secondary electron detector 117. As they pass back up through the lens 104, the returning secondary electrons are deflected by deflectors 112 and 113 which act together as a Wien filter, and into detector 117. Here the return beam is reaccelerated to higher energy by power supply 119 in connection with anode 118 of detector 117 to cause the secondary electrons to impact the Shottky barrier solid state detector 117 at an energy level that is sufficient for amplification. Anode 118 of detector diode 117 is reverse biased by power supply 121. The amplified signal from detector diode 117 then passes to preamplifier 122 after which it is transmitted to the video acquisition pre-processor 48 (see FIG. 1) and associated electronics via a high voltage insulating fiber optic link 126. This signal constitutes the secondary electron component of signal 33 in FIG. 1.

To allow inspection of partially transparent substrates, a transmission electron detector 129 is located below stage 24. Transmitted electrons pass through substrate 57 at high energy and do not require reacceleration. The transmission electrostatic lens (consisting of upper element 123, middle element 124 and lower element 127) is used to spread the transmitted electron beam to a diameter suitable for detection by solid state detector 129. Electrode 123 is held at the same potential as stage 24, while electrode 124 is held at 0 to −3 KV by power supply 114. The signal from transmitted electron detector 129 is amplified by amplifier 133 and transmitted by fiber optic link 135 which is the transmitted electron component of 33 in FIG. 1.

The optical system is also designed to allow the collection of back-scattered electrons which leave the substrate surface at nearly the same energy level as primary electrons. Back-scattered electron detector 160 is a Shottky barrier diode detector similar to detector 117 that it is located to the side of the beam axis. Somewhat different settings of the electrostatic and magnetic Wien filter deflectors 112 and 113, cause this beam to be deflected to the left onto the solid state detector 160, where the signal is amplified by pre-amplifier 162 and passed to pre-processor 48 (see FIG. 1).

For imaging with low voltage beams in the range of 500–1500 eV, elements of the objective lens system are biased considerably differently, and two specific new elements are used. Primary beam electrons are decelerated within the objective lens by floating the substrate 57, lower objective lens pole piece 106 and intermediate electrode 107 at about −19 Kv by means of supply 111. This technique allows the beam to be decelerated only near the end of its path, avoiding aberration and column interaction effects that would greatly degrade the image if the entire beam path were operated at lower beam energy. Under these conditions, the decelerating field between pole pieces 105 and 106 creates a considerable focussing effect. An additional snorkel lens 125 with a single active pole piece below the substrate provides most of the additional magnetic focussing field near the surface. The return flux of this lens passes through pole piece 106 to the outer shell of the snorkel lens. In addition to providing focussing, the strong magnetic field at the substrate assists in extracting low energy secondary electrons from deep features, and tends to keep the secondaries collimated as they are reaccelerated up the objective lens bore 104.

In the low voltage imaging mode, secondary electrons that leave the substrate at about 5 eV are reaccelerated to about 19 KeV within the objective lens. To minimize charging, it is desirable that these electrons pass through a short field free region near the surface. In the low voltage mode the leakage field from the objective lens would create an accelerating field at the substrate surface 57 were it not for the voltage level on intermediate electrode 107. In the low voltage mode, intermediate electrode 107 is biased negative with respect to electrodes 106 creating a field free region that can be adjusted by supply 115 for optimum low voltage imaging. After reacceleration, the secondary electrons pass through the Wien filter deflectors 112 and 113 where they are deflected to the left onto the same detector 160 that is used for backscatter imaging in high voltage mode. Thus the detected signal at preamplifier 162 constitutes the most important image signal used for inspection of wafers at low voltage. Detectors 117 and 129 are not used in this mode for wafer inspection.

Figure 5:
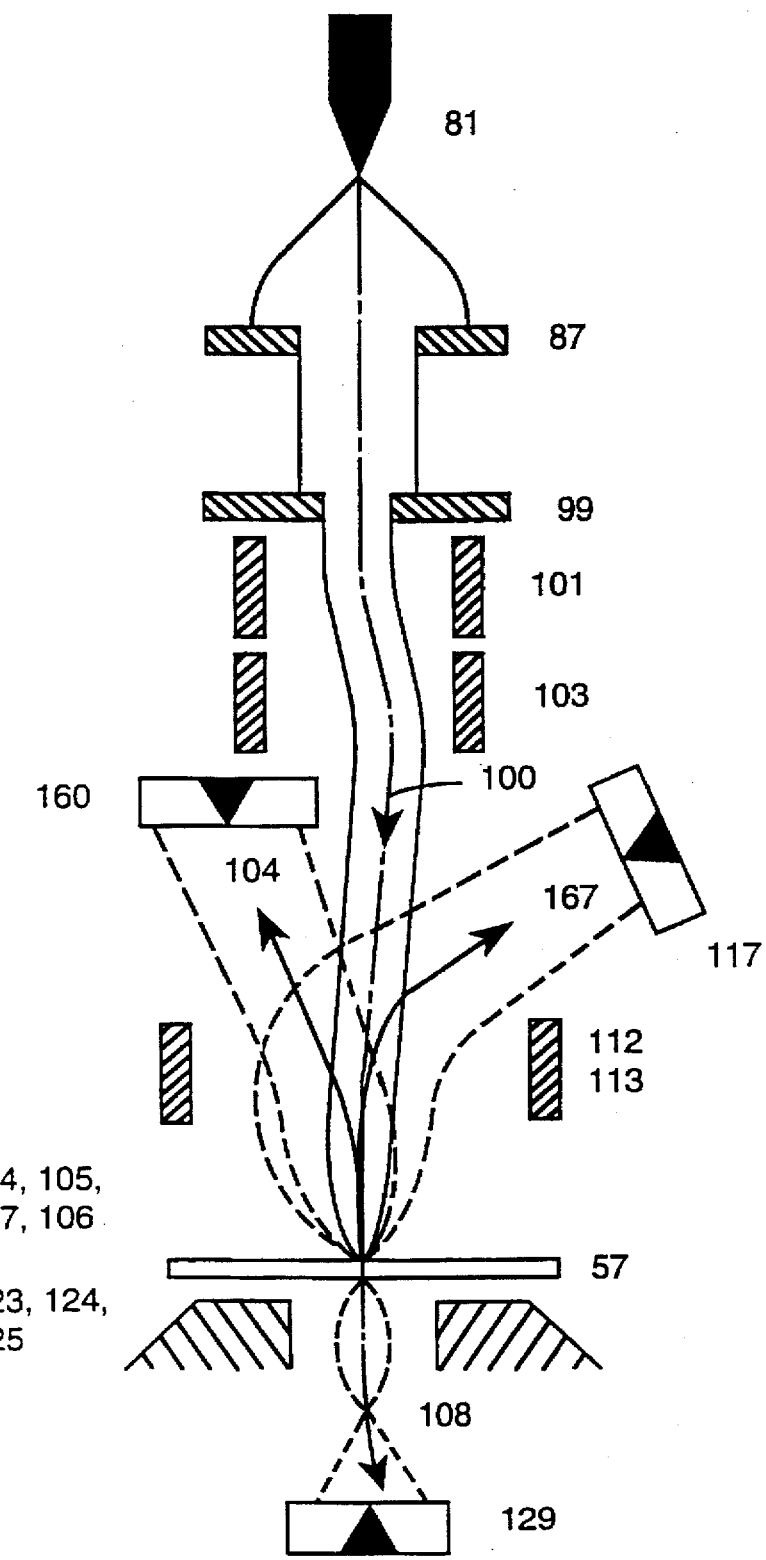
FIG. 5 is a simplified schematic representation of the paths of the primary, secondary, back-scatter and transmitted electrons through the electron optical column and collection system shown in FIG. 4.

FIG. 5 shows a schematic diagram of the various electron beam paths within column 20 and below substrate 57. Electrons are emitted radially from field emission cathode 81 and appear to originate from a very small bright point source. Under the combined action of the accelerating field and condenser lens magnetic field, the beam is collimated into a parallel beam. Gun anode aperture 87 masks off electrons emitted at unusable angles, while the remaining beam continues on to beam limiting aperture 99. Upper deflector 97 (FIG. 4) is used for stigmation and alignment, ensuring that the final beam is round and that it passes through the center of the objective lens consisting of elements 105, 106 and 107 (FIG. 4). Condenser lens 95 (see FIG. 4) is mechanically centered to the axis defined by cathode 81 and limiting aperture 99. The deflection follows the path shown, so that the scanned, focussed probe (beam at point of impact with the substrate) emerges from the objective lens 104.

The diameter of the scanning beam 100 and its current are determined by several factors. The angular emission from the source (1.0 Ma/steradians), and the aperture angle defined by final aperture 99 determine the beam current. The probe diameter is determined by aberrations in both lenses, which are designed for high excitation (field width/focal length) to minimize both spherical and chromatic aberration. The effect of beam interactions (i.e. statistical blurring due to repulsion between individual beam electrons) are also important in this high current system, accounting for about half the probe size on substrate 57. These effects are minimized by avoiding intermediate crossovers, by using a short beam path (40 cm.) and by using lenses with relatively large half angles at the source and substrate 57. To obtain a given spot size, the aperture diameter is chosen to balance all these effects while providing maximum possible current. In this system spot size is primarily adjusted using the aperture, although it is possible to change lens strengths to magnify or demagnify the beam from the source.

In High Voltage mode, Wien filter deflectors 112 and 113 (see FIG. 4) deflect the approximately 100 eV secondary electron beam 167 into detector 117 without substantially influencing the higher energy scanning beam 100. The Wien filter consists of electrostatic octopole deflector 112 and quadrupole magnetic deflector 113, arranged so that the electric and magnetic fields are crossed (perpendicular to each other). Returning secondary electrons are deflected sideways by both fields. However, since primary scanning electrons 100 are travelling in the opposite direction, the strength of these fields may be chosen so that the Wien filter exerts no force upon the primary scanning beam 100 even though it deflects the secondary beam 167 through a large angle. This so called "Wien filter" is used effectively for coaxial extraction. The anode 118 of secondary electron detector 117 is shaped so that during reacceleration, beam 167 is collected and refocussed upon the collector of solid state detector 117.

The paths of detected transmitted and back-scattered electrons are also shown in FIG. 5. To detect back-scattered electrons in high voltage operation, and secondary electrons in low voltage operations, the Wien filter 112 and 113 is excited differently, so that these electrons follow the path shown up the system to the back-scatter detector 160. When partially transparent masks are imaged, electrons can also pass through the substrate surface 57 without losing all their energy. These transmitted electrons pass through electrode system 123 and 124 (FIG. 4) which acts as a lens to spread out the transmitted beam 108 before it hits the detector 129. When transmitted signals are to be obtained in the high voltage mode, a hole in the Snorkel lens 125 allows them to pass without substantially influencing the lens field necessary for low voltage secondary imaging.

In low voltage mode operation, where the substrate 57 and electrodes 106, 107 are floated at high voltage, the objective lens operates quite differently even though the beam paths are similar. Snorkel lens 125 applies a magnetic field which extends through the substrate 57 and into pole piece 106 above. As the electrons decelerate in the field between electrodes 105, 106 and 107, further refraction occurs resulting in a relatively short effective focal length. This kind of decelerating immersion lens has remarkably low aberrations. It differs from conventional cathode lenses used in emission microscopy, insofar as electrode 107 is biased negatively to form a short electric field free region near substrate 57. With this electrode, it is possible to bias the surface in such a way that some low energy secondary electrons return to the substrate to neutralize charging effects.

Those secondary electrons that escape the field free region are re-accelerated in the region between electrodes 107 and 105. They emerge from electrode 105 at an energy approximately equal to the 20 KeV primary beam energy from the gun minus their landing energy on the substrate. In the objective region, the secondary paths are similar to the primary beam, but at much larger angles since secondaries are emitted with a broad angular distribution. This secondary electron beam is directed toward the low voltage secondary electron detector 160 which is the same detector used for backscatter imaging at high voltage. Since the energy of the returning secondary beam 104 is comparable to the primary beam energy, much stronger Wien filter 112 and 113 deflections are required, but this can be done without substantially influencing the primary beam path 100.

Since the low voltage mode is frequently to be used for the inspection of partially insulating surfaces, the techniques used to minimize charging are an important aspect of the present invention. Charging of an insulating region occurs when the number of secondary electrons (low energy secondaries & backscatters) does not equal the number of primary beam electrons incident upon the surface. For any surface that gives an image, this charge balance varies depending upon the topography and material. The secondary electron scattering yield varies with the energy of the incident beam, but for most materials is greater than one in the range of about 200–1500 eV and otherwise less than one. When the yield is greater than one, the surface will charge positively.

Secondary electrons leave the surface of substrate 57 with energies in the range of 0–20 eV with the most probable energy near 2.5 eV. If the electric field near the surface of substrate 57 can be controlled, in this case by the potential upon intermediate electrode 107, secondary electrons can be encouraged to leave that surface or return to it, depending upon the applied field and the energy that they leave with. For example if an approximately 10 eV retarding potential barrier is established, then only some of the secondaries emitted from a point on the surface 57 would escape to the detector.

If the number of escaping secondary and backscattered electrons is greater than the number of primary beam electrons, surface 57 will charge positively which will increase the size of the retarding potential barrier created by electrode 107. Fewer low energy secondary electrons will now escape. The surface potential will move positively until balance is reached. If the number of escaping secondary and backscattered electrons is less than the number of primary electrons, the surface will charge negatively, which will lower the retarding potential barrier created by electrode 107. A larger number of low energy secondary electrons will now escape. The surface potential will move negatively until balance is reached. Under these conditions, a stable surface potential will emerge after some period of time. To avoid creating large potential differences between areas on the substrate, it is essential to properly adjust electrode 107 so that the equilibrium condition (primarily beam current equal to secondary electron current) is obtained on average.

Since topographical and material differences affect the secondary electron yield, different areas on a substrate will tend to different equilibrium voltages. However, in equilibrium all areas produce the same number of secondary electrons. This means that there is no contrast for substrates imaged in the equilibrium state. To circumvent this problem the dose per pixel is kept very low and if necessary the area rescanned by the "multiple frame scan" technique described earlier to obtain favorable image statistics.

By controlling the time between scan passes, the surface has the opportunity to neutralize in-between scans, using electrons generated in adjacent regions. The key elements in this strategy are the field controlling electrode 107, and the overlapping frame scan trajectory.

Figure 6:
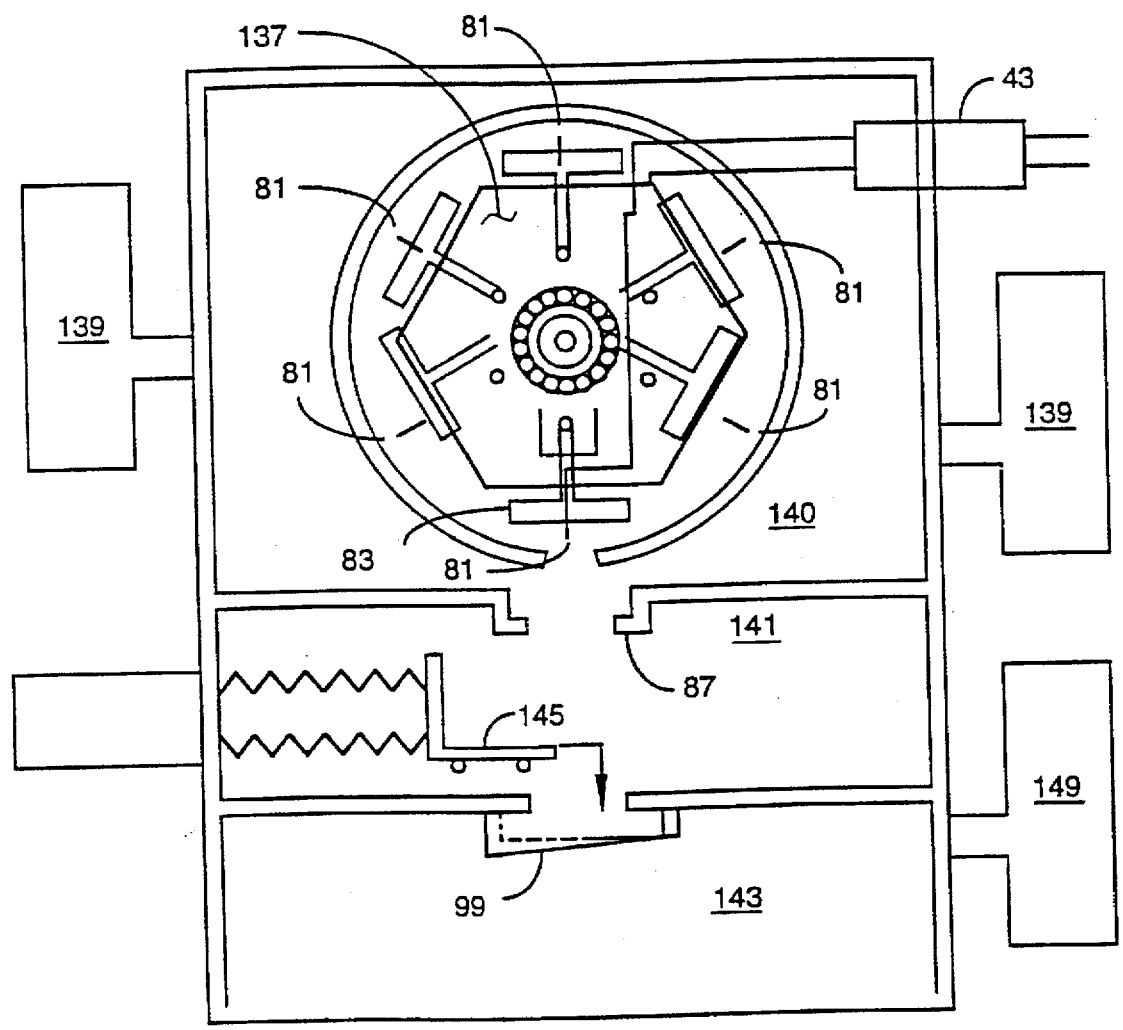
FIG. 6 is a simplified schematic representation of a multi-head electron gun and vacuum configuration.

As shown in FIG. 6, to maximize gun reliability in the face of limited cathode lifetime, the gun structure contains six cathode/control electrode assemblies mounted upon a hexagonal rotating turret 137 floating at high voltage. Each assembly may be rotated into position above anode aperture 87, and locked into position while making electrical contact with the appropriate power supplies, 91 and 93 (FIG. 4).

The electrostatic deflection system, consisting of pre-lens deflectors 101 and 103 (see FIG. 4), requires very homogeneous fields driven by high speed sawtooth deflection voltages. The structure is a monolithic ceramic/metal assembly etched to form 20 individual deflection plates. Four drivers are required for each of the two stages, to provide a scan that can be rotated to match the stage 24 and substrate 57 coordinate systems.

Automatic tuning and set up are provided for operator ease. Lens and deflection/stigmation elements and all high voltage supplies are under DAC control, interfaced to column control computer 42 (see FIG. 1). In several cases, routines to adjust deflection ratios and electrostatic plate voltages for specific functions are resident in the column control computer 42, and gun control and setup is based on nominal values, modified by adaptive routines using A/D feedback for emission current, aperture current, and supply settings.

Beam centering is based upon other well known routines that eliminate deflections when lens currents are changed. These operations use specific test samples imaged by a two axis frame scan function, and they exploit image analysis capability that is also necessary for alignment and inspection. Focus is maintained automatically to compensate for substrate height variations, while stigmation is performed prior to inspection. These routines are based upon analysis of the contrast and harmonic content of images using the acquisition pre-processor 48 and related electronics.

In the present invention the nominal operating conditions of the optics for high voltage mode are a 20 KeV beam energy and beam current spot size relationship varying from 300 nA at 0.05 µm to 1000 nA at 0.2 µm. The scan period is 5 microseconds using a 512 pixel scan field imaged at 100 Megapixels/sec. Detector 117 current amplification in the diode is about 1000× at 5 KV to 5000× at 20 KeV. The overall system can perform over this range of operating conditions for samples of more than about 14% edge contrast at 100 Megapixels/sec using a 0.05 micrometer spot. The acquisition electronics makes provision for integrating more than one scan line, allowing lower contrast or high resolution images to be recorded at lower bandwidth.

In low voltage mode, the beam energy up to electrode 105 is 20 KeV and the beam energy at the substrate is 800 eV. The beam current spot size relationship is 25 na at 0.05 µm and 150 na at 0.1 µm. The scan period and field size are the same as high voltage mode. Detector 160 amplification is 5000×. The system can perform over this range of operating conditions for samples of more than about 20% of edge contrast at 100 megapixels/sec using a 0.05 micrometer spot.

DEFECT PROCESSOR

In the case of die-to-die inspection, the function of defect processor 56 is to compare image data derived from die 68 with image date derived from die 70, or, in the case of die-to-database inspection, to compare image data derived from die 64 with data derived from the database adaptor 54. The routines and the basic implementation of defect processor 56 are substantially the same as those of the defect processor described in U.S. Pat. No. 4,644,172 (Sandland et al; "Electronic Control of an Automatic Wafer Inspection System", issued Feb. 17, 1987 and assigned to the same assignee as the present application) which uses three parameters to determine defect locations whereas the present invention uses four.

All data for either die-to-die or die-to-database inspection are received either from memory block 52 or, after alignment correction, from the alignment computer 21 (depending on how the alignment correction is implemented), and are in the form of six bits per pixel for each detector type. In defect processor 56 four parameters are determined for each pixel for each type of detector of both inputs:

a. I, the gray scale value of the pixel;

b. G, the magnitude of the gradient of the gray scale pixel;

c. P, the phase or direction of the gradient of the gray scale value; and d. C, the curvature of the local gradient contour.

The gray scale value is merely the value in memory block 52 for the particular pixel. The magnitude of the gradient and the direction of the gradient are derived from first computing the x and y Sobel operator components:

$$S_x = \begin{matrix} -1 & 0 & 1 \\ -2 & 0 & 2 \\ -1 & 0 & 1 \end{matrix} \quad S_y = \begin{matrix} 1 & 2 & 1 \\ 0 & 0 & 0 \\ -1 & -2 & -1 \end{matrix}$$

The magnitude of the gradient is then $((S_x)^2 + (S_y)^2)^{1/2}$ and the direction is $\tan^{-1}(S_y/S_x)$.

The curvature is defined as:

$$C = \begin{matrix} a_{11}R_{-2,-2} & a_{12}R_{-2,-1} & a_{13}R_{-2,0} & a_{14}R_{-2,1} & a_{15}R_{-2,2} \\ a_{21}R_{-1,-2} & a_{22}R_{-1,-1} & a_{23}R_{-1,0} & a_{24}R_{-1,1} & a_{25}R_{-1,2} \\ a_{31}R_{0,-2} & a_{32}R_{0,-1} & a_{33}R_{0,0} & a_{34}R_{0,1} & a_{35}R_{0,1} \\ a_{41}R_{1,-2} & a_{42}R_{1,-1} & a_{43}R_{1,0} & a_{44}R_{1,1} & a_{45}R_{1,2} \\ a_{51}R_{2,-2} & a_{52}R_{2,-1} & a_{53}R_{2,0} & a_{54}r_{2,1} & a_{55}R_{2,2} \end{matrix}$$

where the coefficient $a_{ij}$ is a set of parameters selected depending on the application and $R_{ij}$ is defined to be:

$$R_{ij} = \begin{matrix} b_{11}I_{-1,1} & b_{12}I_{0,0} & b_{13}I_{-1,1} \\ b_{21}I_{0,1} & b_{22}I_{0,0} & b_{23}I_{0,1} \\ b_{31}I_{1,1} & b_{32}I_{1,0} & b_{33}I_{1,1} \end{matrix}$$

Where $I_{ij}$ is the gray scale value of a pixel in the $i^{th}$ column and the $j^{th}$ row of the image and $a_{ij}$ and $b_{kl}$ are parameters derived empirically.

Typical values for the preferred embodiments are:

$$b_{ij} = \begin{matrix} & 1 & 2 & 1 & \\ & 2 & 4 & 2 & \\ & 1 & 2 & 1 & \end{matrix} \quad a_{ij} = \begin{matrix} 0 & -1 & 2 & -1 & 0 \\ -1 & 2 & -2 & 2 & -1 \\ -2 & -2 & 0 & -2 & -2 \\ -1 & 2 & -2 & 2 & -1 \\ 0 & -1 & 2 & -1 & 0 \end{matrix}$$

In the manner described above, quantities I, G, P and C are determined for each pixel of both images. For any given pixel A of die 68, these parameters are then compared with the same parameters of the corresponding pixel, B, on die 70 and also with the parameters of the eight pixels immediately adjacent to B. If for every pixel in the neighborhood of B at least one parameter differs from the same parameter of pixel A by a value greater than a predetermined tolerance, pixel B is flagged as a defect of both dice.

In a similar manner, the parameters of every pixel of die 70 are compared with the parameters of pixels in the corresponding neighborhood of die 68 and the appropriate pixels are flagged as being defective.

The physical implementation of this algorithm is performed in pipeline logic, as described in U.S. Pat. No. 4,644,172 (Sandland et al; "Electronic Control of an Automatic Wafer Inspection System", issued Feb. 17, 1987 and assigned to the same assignee as the present application). The matrix operations are implemented in Application Specific Integrated Circuit (ASIC) devices which are cascaded in a pipe line computational system capable of computing defect data at a rate of 100 Megapixels/second.

DEFLECTION CONTROLLER

Figure 7:
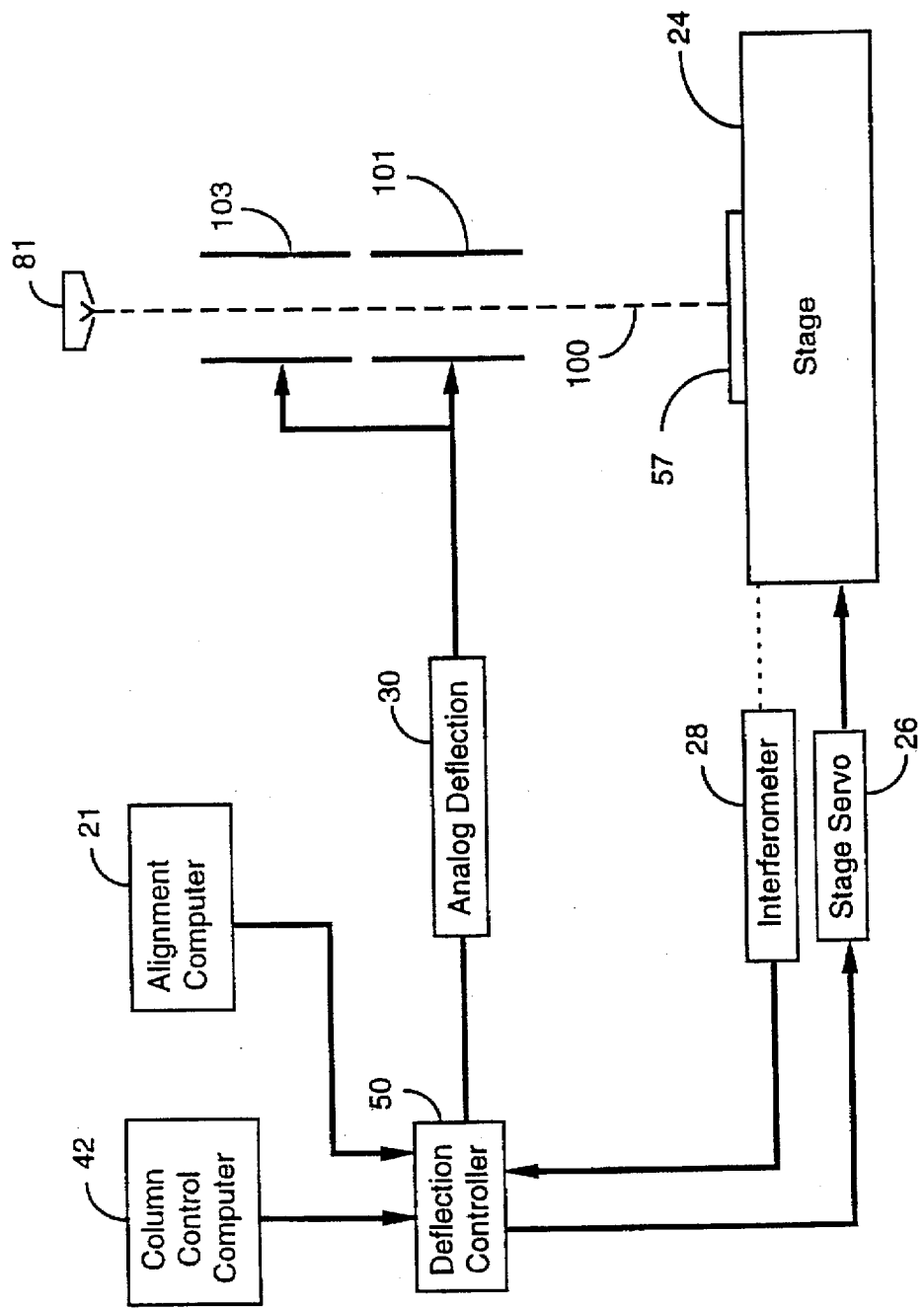
FIG. 7 is a block diagram of the positioning control subsystem of the present invention.

In die-to-die mode, the function of deflection controller 50 is to position the electron beam 100 at equidistant grid points within each swath 60 of die 68 so that the outputs of the detectors 129, 160 and 117 can be compared with the outputs of the same detectors at the corresponding location on die 70. Similarly, in die-to-database mode the simulated image derived from database adaptor 54 is compared with the detector 117 output from a die. Deflection controller 50 accomplishes this by controlling the positions of stage 24 and of electron beam 100 as shown in FIG. 7 and explained below.

When scanning the first die in a swath, the output of alignment computer 21 is set to zero, because during the scanning of the first swath of the first die there cannot be a misalignment. Therefore, during this period, deflection controller 50 receives its instruction only from column computer 42. Based on these instructions and the position data received from the x and y interferometers 28, deflection controller 50 calculates the desired motion of stage 24 and transmits corresponding signals to stage servo 26 to move stage 24 accordingly. Deflection controller 50 similarly calculates the desired deflection of beam 100 and transfers this data to analog deflection circuit 30. As stage 24 moves, its position is constantly monitored by x and y interferometers 28 and any discrepancies from the desired stage position are determined and used to generate an error signal which is fed back to the stage servo drive 26 by deflection controller 50. Because of the high inertia of stage 24, these error signals cannot correct for high frequency errors in the stage position. The high frequency errors, in both x and y, are corrected by the deflection of electron beam 100, as computed by deflection controller 50 which transmits these signals in digital form to analog deflection circuits 30.

As beam 100 scans die 68, gray scale values are stored in memory block 52. As soon as electron beam 100 starts scanning die 70 these values are also stored in memory block 52 and are immediately also transferred both to defect processor 56 and alignment computer 21. In alignment computer 21 the two data streams, one derived from die 68 and another from die 70, are compared for alignment. If there is a misalignment, an alignment correction signal is generated and transferred to deflection controller 50. This alignment signal is then used as a vernier correction to position beam 100 at the correct location on substrate 57.

In die-to-database mode, deflection controller 50 functions similarly to the way it functioned in the die-to-die mode, except that the output of database adaptor 54 replaces the input image derived from the first die in the swath.

The deflection controller 50 also computes and defines the stage 24 motion, speed and direction, as well as the parameters of the electron beam deflection.

ALIGNMENT COMPUTER

The function of alignment computer 21 is to accept two digitized images in the form of gray scale values, and determine, in terms of fractional pixel distances, the misalignment between these images. The preferred embodiment of these alignment calculations is described in U.S. Pat. No. 4,805,123 (Specht et al; "Automatic Photomask and Reticle Inspection Method and Apparatus Including Improved Defect Detector and Alignment Sub-System", issued Feb. 14, 1989 and assigned to the same assignee as the present application). In this preferred embodiment the alignment correction is continuously calculated throughout the entire care area. The calculated alignment correction may be used by the alignment computer to shift, or to shift and interpolate (for a subpixel shift) the images read from memory block 52 and sent to the defect processor so that the images are correctly aligned when examined by the Defect Processor 56. Alternately, one may select a few specific features on the substrate 57, and calculate the misalignment only at these features, assuming that alignment does not change rapidly throughout the scanning process. In the latter case, a single board computer, such as the Force Computer, Inc. model CPU 30ZBE may be used to perform the alignment calculations. These calculated shifts may be used to shift the positions of subsequent data acquisitions to reduce misalignments or may be used to determine shifts between the images that are sent from the memory block 52 to the defect processor 56.

ANALOG DEFLECTION

Figure 9:
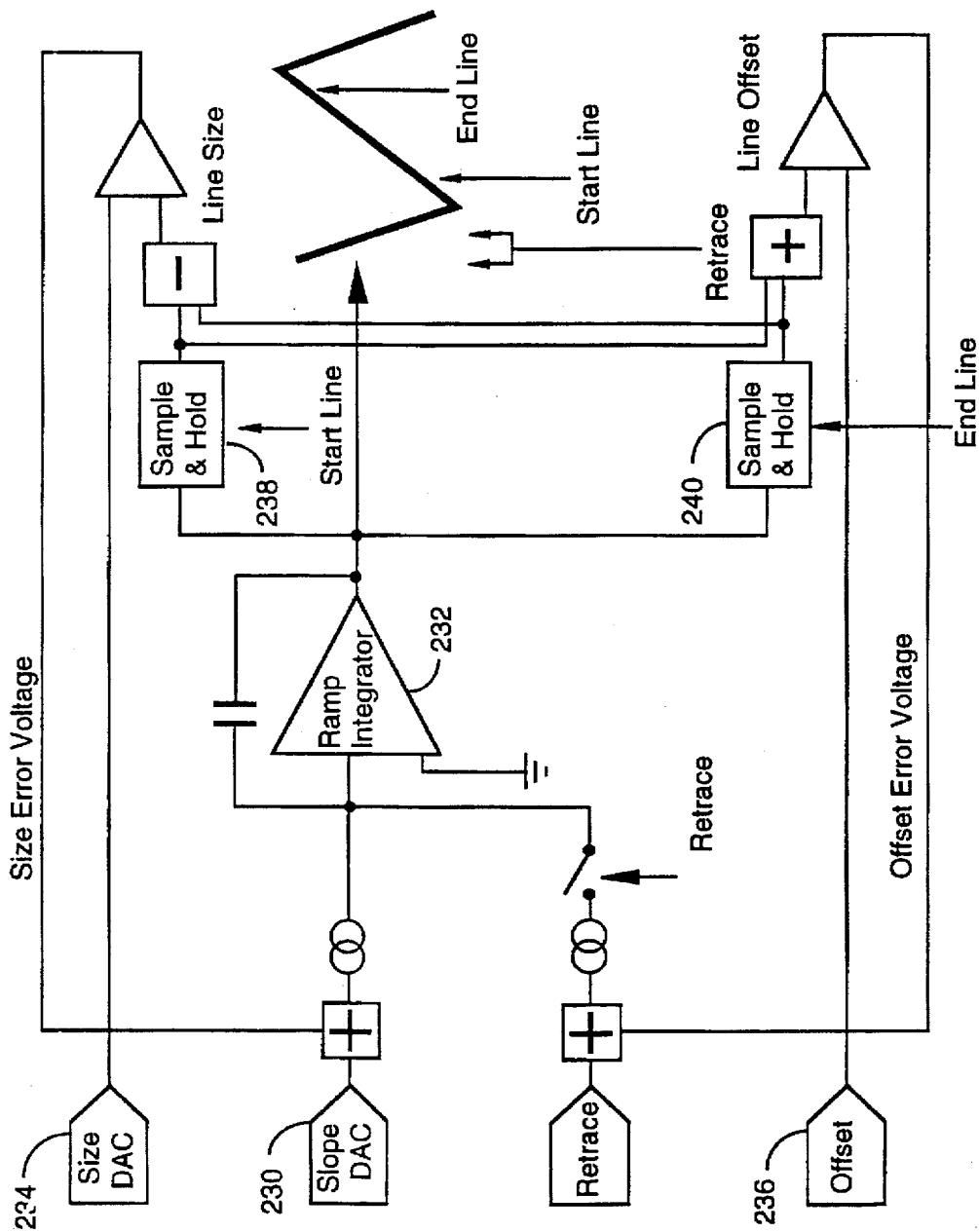
FIG. 9 is a block diagram of the analog deflection system of the present invention.

Analog deflection circuit 30 generates analog ramp functions for deflector plates 101 and 103 (FIG. 4). The operation of this subsystem is shown in FIG. 9. The digital signal derived from deflection controller 50 is converted to an analog voltage by slope DAC 230 the output of which feeds ramp generator 232. The amplitude of the ramp is variable through the use of DAC 234, while the offset is controlled by DAC 236. Sample and hold circuits 238 and 240 are used to define the start and the end of the ramp, respectively. High voltage, low noise drivers then amplify the waveform to produce a ramp with a dynamic range of ±180 V which is applied to deflector plates 101 and 103.

MEMORY BLOCK

The Memory Block 52 consists of three identical modules, with each one corresponding to a different one of each type of detectors 117, 129 and 160.

Figure 10:
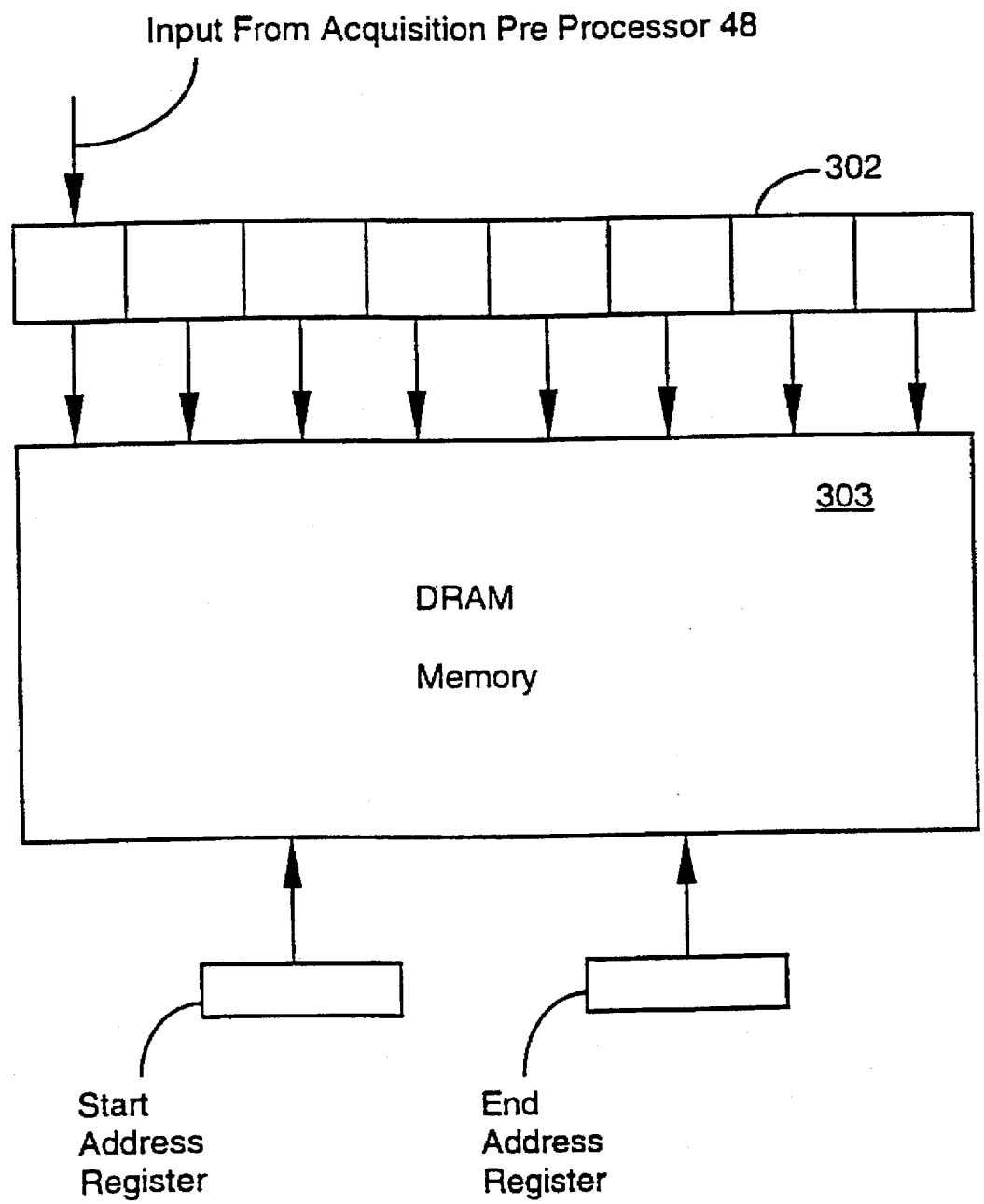
FIG. 10 is a block diagram of the memory of the present invention as shown in FIG. 1.

Referring to FIG. 10, conceptually, each module of memory block 52 consists of two FIFOs (First In—First Out) memories. The first FIFO stores the gray scale values corresponding to each detector of an entire swath derived from die 68, while the second FIFO is much shorter and stores the gray values, again for each detector, corresponding to only a few scans of die 70. The outputs from these two FIFOs are then transmitted to defect processor 56 and alignment computer 21. Each FIFO functions at a rate of 100 Mhz and stores each pixel's gray scale value with a precision of 8 bits per detector.

The memory accepts in its input register 302, 8 bytes in parallel from acquisition pre-processor 48 for each type of detector. Input register 302, acting like a shift register, shifts the eight bytes to the right and then accepts another eight bytes, until such time that the eight sections of the input register a full. At that time all 64 bytes are clocked into memory 303.

One way to implement this is with DRAMs 303. Ordinarily 128 megabytes would be used in a system.

ACQUISITION PRE-PROCESSOR

Acquisition pre-processor 48 converts the analog signal from each detector 117, 160 and 129 and digitizes these to an eight bit value at a rate of 100 Mhz, then reformats the output signal for storage in memory block 52.

Figure 11:
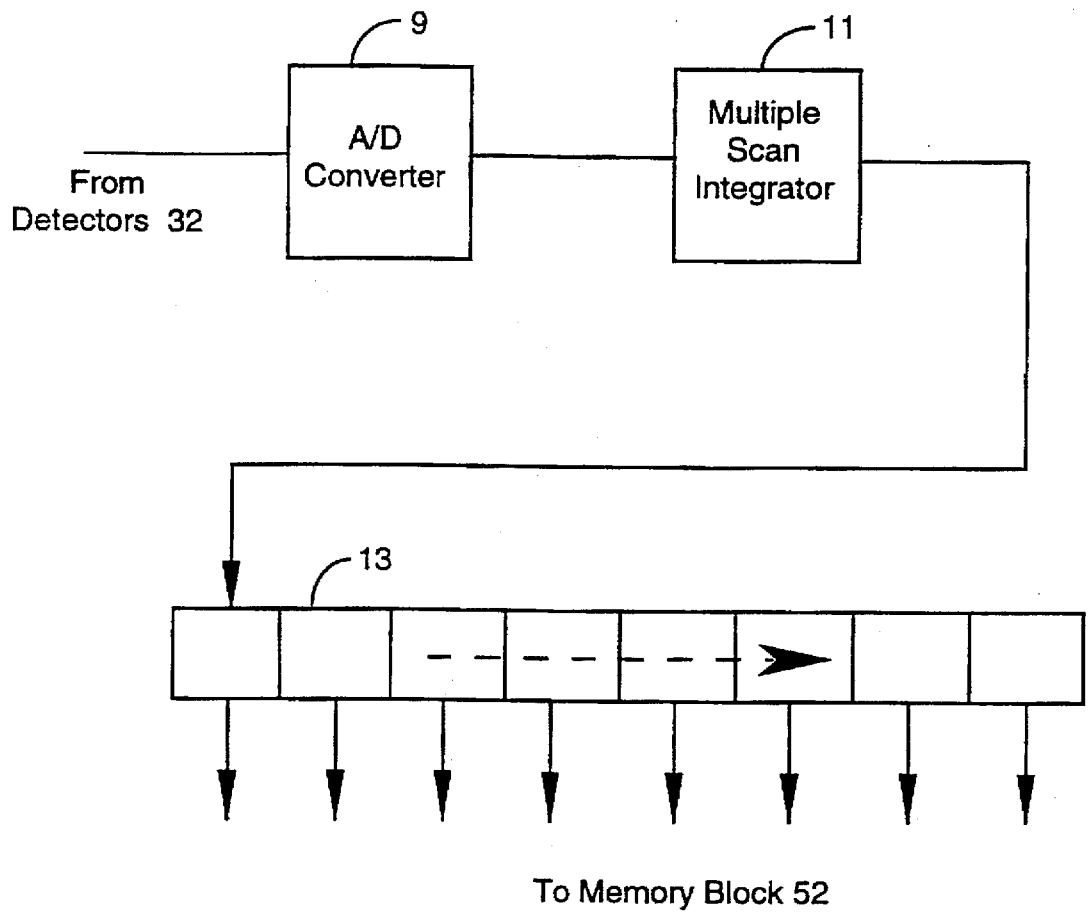
FIG. 11 is a block diagram of the acquisition pre-processor of the present invention.

Acquisition pre-processor 48 consists of three identical modules, one of which is shown in FIG. 11. Each module accepts an output from its corresponding detector and digitizes that output to an accuracy of 8 bits and then places it into multiple scan integrator 11. The purpose of multiple scan integrator 11 is to average the gray scale values from the same pixel for the reduction of noise. Under certain circumstances the pixel may be rescanned, i.e. resampled several times and the resultant value is the average of the values for that pixel. This value is then transferred to shift register 13 which accepts eight bytes in series before transferring them in parallel to memory block 52.

INTERFEROMETERS

The x and y positions of stage 24 are monitored by x and y interferometers 28, such as Teletrac TIPS V. The positions are defined to 28-bit precision where the least significant bit corresponds to approximately 2.5 nanometers.

SYSTEM COMPUTER

Overall control of system 10 is provided by a system computer 36 which, among its other housekeeping tasks, ensures that various step sequences are performed in an orderly manner. Each event in the sequence is accomplished at the programmed time, with a number of nonconflicting sequences performed simultaneously to maximize throughput of computer 36.

The routines preformed by computer 36 are designed such that user interaction with the system is either through keyboard 40 with an associated mouse or trackball pointing device, or by data communication with a remote computer. For local interaction, computer display 38 displays graphics and text from system computer 36.

The system computer 36 routines are organized into four communicating "tasks". These are:

1. A Master Task through which passes all communication with column control computer 42, post processor 58, and mask handler 34. This task also maintains files on the system computer that record machine operating parameters such as lens settings, vacuum pressures, and beam currents.
2. A User Interface Task that manages displays on computer display 38 and that handles keyboard 40 and mouse input. This task responds to user keyboard 40 and mouse input by modifying data files and by sending messages to other parts of the system to initiate actions.
3. An Inspect Task that sends descriptions of image acquisition swaths to column control computer 42 (via the Master Task).
4. A Command Language Interpreter Task that can accept command inputs from keyboard 40. This task also manages timers that enable the automatic scheduling of repetitive operations. In addition, this task creates and updates a text logfile describing all machine operations and the time they occurred. Normally this task is only used for machine control by service engineers.

An example of a system computer is a Sun Microsystems SPARC processor that runs under a UNIX operating system. (UNIX is a registered trademark of AT&T.)

COLUMN CONTROL COMPUTER

Column control computer 42 consists of the autofocus computer, vacuum control computer and deflection instruction computer. The functions and implementation of the autofocus computer is covered under the headings Autofocus System and the Vacuum System is described under the heading of Vacuum System.

Column control computer 42 receives its instructions from system computer 36.

The column computer 42 is implemented in a 68030-based single board computer, such as the CPU 30ZBE made by Force Computer, Inc.

POST PROCESSOR

Post processor 58 receives from defect processor 56, a map that identifies every defective pixel for each type of detector. The post processor 58 concatenates these maps to determine the size and location of each defect and classifies these by defect type. These data are then made available to system computer 36. Physically, post processor 58 can be implemented as a 68030 single board computer, such as model CPU 30ZBE made by Force Computer, Inc.

VIDEO FRAME BUFFER

Video frame buffer 44 is a commercially available video frame memory with a storage capacity of 480×512 pixels, at 12 bits per pixel. A suitable frame buffer is the Image Technology, Inc. model FG100V. The video frame buffer refreshes image display 46 30 times a second.

IMAGE DISPLAY

Image display 46 is a commercially available color monitor, such as the SONY model PVM 1342Q. False color techniques are employed to aid the evaluation of the image by the operator. Such techniques assign different colors to the different gray shade values of a monochromatic image.

DATABASE ADAPTOR

Database adaptor 54 is an image simulator that produces gray scale values corresponding to each pixel on the basis of computer aided design data used for the making of the pattern in the die. Typically, the input to the database adaptor is a digital magnetic tape in a format used for the generation of the pattern for the integrated circuit. These digital data are then converted to a stream of pixel data organized in swaths, in the same format as the output of acquisition pre-processor 48. Such a database adaptor was previously disclosed in U.S. Pat. No. 4,926,489 (Danielson et al; "Reticle Inspection System", issued May 15, 1990 and assigned to the same assignee as the present application).

SUBSTRATE HANDLER

The function of substrate handler 34 is to automatically extract substrate 57 from the cassette and place it in the substrate holder in the proper orientation. It is a robotics device that is similar to wafer handlers in common use for transporting and manipulating wafers in the semiconductor industry. The first function of the handler is to determine the orientation of the flat 59 of FIGS. 2 and 3a. Handler 34 senses the flat optically with a linear CCD sensor oriented radially with respect to the rotational center of the substrate. As the substrate rotates, the output of the image sensor is converted to digital form and is then stored in a single board computer, such as the Force Computer, Inc. CPU 30ZBE. The computer determines the location of flat 59. The substrate is then rotated into the proper orientation and automatically placed into a substrate holder. The holder, now containing the substrate, is loaded into load elevator 210 of FIG. 8. All operations of the handler are executed under the control of system computer 36.

STAGE

The function of stage 24 is to move substrate 57 under electron beam 100 and under optical alignment system 22. In order to minimize the complexity of the system, stage 24 has been selected to only have two degrees of freedom: x and y; it can neither rotate nor move in the direction perpendicular to the x-y plane of substrate 57. In other words, the stage can only be translated in x, y or diagonal directions. Instead, rotation of the E-Beam raster is accomplished electronically, by resolving any scan into the two components of the electrostatic deflection of the beam and also moving the stage with the mechanical servos in a similar manner. Z-axis motion is not required because the objective lens has sufficient range in its variable focus to compensate for any height variations in substrate.

The stage 24 is a precision device with closely controlled straightness, orthogonality and repeatability. Crossed roller bearings are employed. The stage is vacuum compatible and nonmagnetic, so as not to interfere with electron beam 100. It has an open frame, so that transmission electron beam 108 can reach detector 129 below it. The open frame is also used to place substrate 57 on it from below in the loading process.

Three-phase brushless linear motors (not shown), two per axis, have been selected to drive stage 24 for best overall system performance. Suitable linear motors are the Anoline models L1 and L2 made by Anorad, Inc.

VACUUM SYSTEM

The entire vacuum system is under the control of column control computer 42. Conventional pressure sensors (not shown) within various parts of the system measure the pressure and report this to column control computer 42. This computer then sequences various valves, as necessary, on start-up or during the loading or unloading of a substrate. The latter routine is explained in more detail under the heading of Load Operation. Should the vacuum be inadequate for the electron beam operation, the high voltage is automatically cut off to protect source 81 from damage. This done with pressure sensors in combination with computers 42 and 36. Simultaneously, pneumatic isolation valve 145 (FIGS. 6 and 8) is also actuated to protect the ultrahigh vacuum region 140 of the column from contamination. The operation of the vacuum system is explained in detail below.

The vacuum system of the gun is a two stage differentially pumped system designed to be pre-baked and otherwise to be maintained indefinitely without servicing. Ultra High Vacuum, (approximately $10^{-9}$ Torr) region 140 is pumped by ion pumps 139 and isolated by gun anode aperture 87. Intermediate (approximately $10^{-8}$ Torr) vacuum region 141 is also ion pumped, by pump 149, and is separated from main system vacuum region 143 by pneumatic gun isolation valve 145 and by aperture assembly 99. Together these vacuum elements provide an environment suitable for field emission in a production environment.

The vacuum in lower column region 143 is maintained by turbopump 204 just as the vacuum in inspection chamber 206 is provided by turbopump 208. Inspection chamber 206 is separated from lower column region 143 by a plate which has a small hole through which the electron beam can pass. This separation of vacuum regions 206 and 143 permits high vacuum to be maintained even when the substrate to be inspected is coated with a photoresist material which typically has a significant vapor pressure.

The vacuum system has two air locks, 224 and 226, one to load a substrate 57 into inspection chamber 206 and one to unload the substrate after inspection. Each chamber is connected to the vacuum pumps via two valves, 212 and 214, in a parallel configuration. Valve 212 is for slow pumping of the lock chamber 224 while valve 214 has a large orifice and is able to handle a large volume. A similar arrangement, also shown using valves 212 and 214, is provided for chamber 226. The purpose of this dual arrangement is to preclude particles being stirred up in the evacuation process and yet minimize the time required for evacuation and repressurization of the chambers.

As will be explained in more detail below, initially, after the substrate has been placed in load lock 224, only the slow valve 212 is opened, thereby ensuring that the flow rate in the chamber is sufficiently slow so as not to stir up particles in the lock area 224. Once the pressure in the chamber has been reduced to a level that the air flow is in the free molecular flow region, a region where particles are no longer stirred up, the large valve 214 is opened in order to rapidly evacuate the remaining air in the lock. A similar two-step operation is used in the repressurization process, where valves 228 and 230 provide fast and slow venting for each chamber 224 and 226.

LOAD OPERATION

As previously described, substrate 57 is mated with an adaptor in mask handler 34 and is placed into load elevator 210. Load lock 224 is, at this time, at atmospheric pressure. Valve 212, a valve that permits only slow evacuation of the load lock 224, opens. When lock 224 has reached a pressure where the flow becomes molecular, valve 214, a high capacity valve, is opened and the remainder of the air is pumped out. Now gate valve 216 is opened and elevator 210 pushes substrate 57 and holder through valve 216, into inspection chamber 206 and places it on stage 24. After substrate 57 has been inspected, the reverse process takes place and substrate 57 is replaced in a cassette used to store substrates.

Alternately, a cassette of substrates could be loaded into the chamber in a similar way, each of the collection of substrates inspected and then the entire cassette of substrates removed and replaced with the next cassette of substrates.

Further still, the double lock arrangement of the present invention makes it possible to be inspecting one substrate in one chamber while simultaneously a second substrate is either being inserted and pressurized, or depressurized and removed, using the second chamber.

AUTOFOCUS SYSTEM

Electron beam 100 is focused by varying the current in the system's objective lens 104 (FIG. 4). Due to the fact that substrates are not always flat, and because the surface of stage 24 may not be perfectly perpendicular to the axis of column 20, the optimum focus current varies over the care area. Because this variation is slow as a function of distance in the x and y directions, it is feasible to determine the optimum focus current at a few designated points, and for any points in between these one may interpolate the desired focus current.

As part of the set-up and initialization of the inspection process, the system measures the optimum focus current at designated points. This focus calibration process consists of positioning the beam at the designated point and then measuring the gray scale value along a straight line perpendicular to an edge of a feature on substrate 57. The digitized gray scale values are then convolved with a high pass filter (not shown) for 10 differing values of focus current, for example. The best focus is then the current corresponding to the highest output from the high pass filter. In the preferred embodiment a second derivative filter is used with the following convolution coefficients as follows in this example:

–4 0 0 0 8 0 0 0 –4

For best results the output of the high pass filter should be smoothed.

The focus computer is part of column control computer 42. The focus computation is carried out in special purpose hardware consisting of a convolver integrated circuit and some DSP elements.

OPTICAL ALIGNMENT SYSTEM

Optical alignment system 22 is used by the operator to visually perform coarse alignment of the die after it enters the inspection chamber. The subsystem consists of a window into the vacuum chamber and lenses to project image patterns on a CCD camera for display on display 46. The operator can chose one of two lenses, (in the present invention these were empirically determined) one with a magnification of 0.46 and the other one with a magnification of 5.8 for the viewing of the pattern. In order to preclude the coating of optical surfaces with contamination from the substrate, all lenses are located outside the vacuum.

SEM PLASMA CLEANER

In the course of operation of the electron beam apparatus of the present invention, organic materials are deposited on various deflection and beam forming electrodes by proximity interaction (near surface charging of particles), and volatilization of target material then drawn to high tension regions. The resulting dielectric accumulations over time will, through surface charging, adversely affect beam steering and forming mechanisms. Necessary periodic removal of these materials is accomplished through employment of an oxidizing plasma formed in close proximity to those areas of accumulation.

Figure 8:
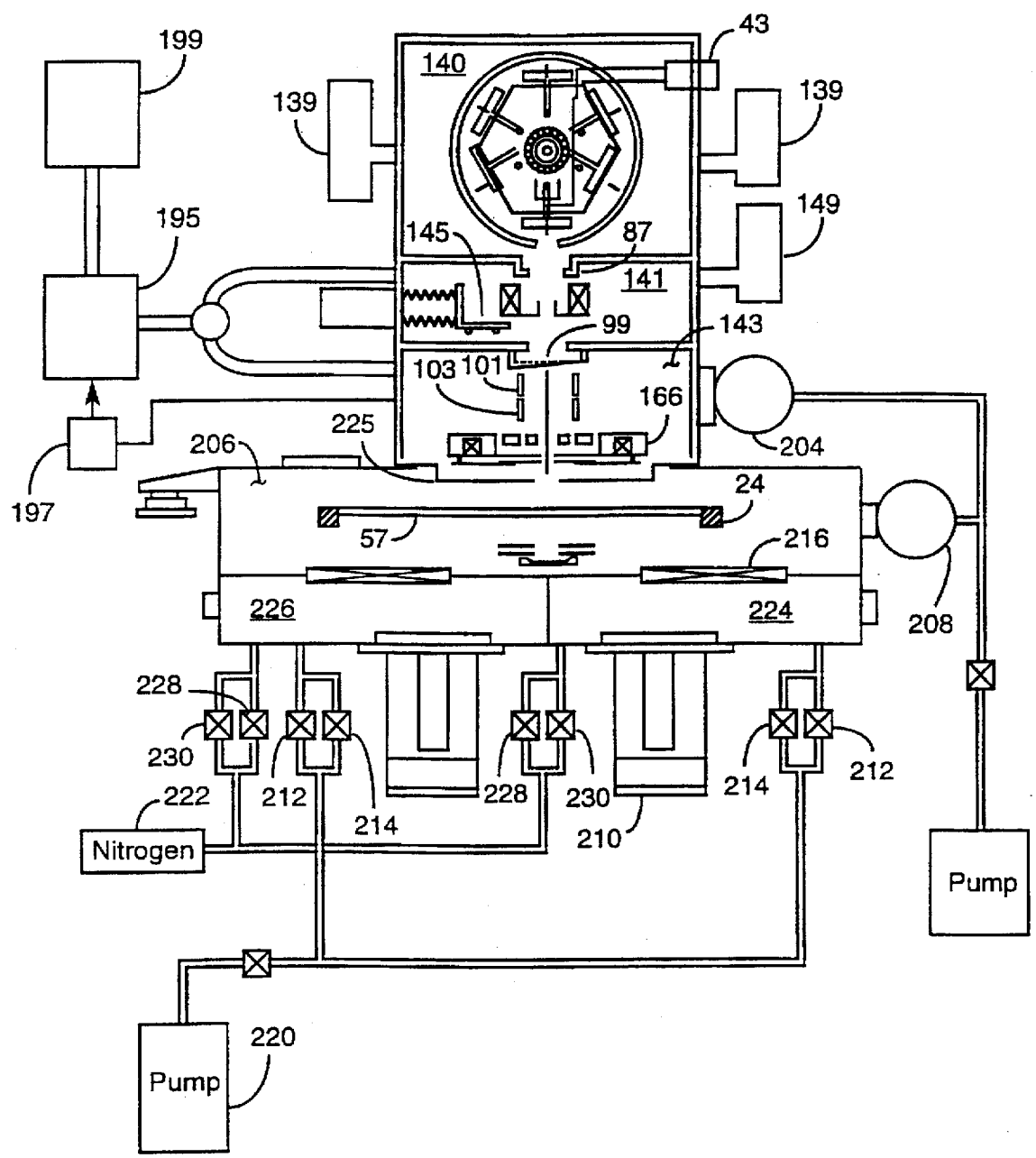
FIG. 8 is a schematic representation of the vacuum system of the present invention.

To perform that function, oxygen is used as the primary gas for the formation of a cleaning plasma. Referring to FIG. 8, oxygen supply 199 is introduced into the upper or lower portion of the chambers, 141 and 143, respectively, via valve 193 and regulated using a mass flow controller 195 to produce a controlled pressure sensed by capacitance manometer 197. Oxygen pressure is adjusted to optimize coupling of RF energy and localize the plasma excitation to each sequentially selected electrode, or other electrodes needed to clean other regions of the operating space, all having differing mean free paths for ionization. Oxidation of only the organics takes place by tightly controlling the spatial plasma density in discharge regions to a level just below the sputtering potential of the electrode surfaces. This is accomplished by suppression of electrode self biasing at high frequencies and precise RF power leveling, and/or voltage limiting.

Figure 12:
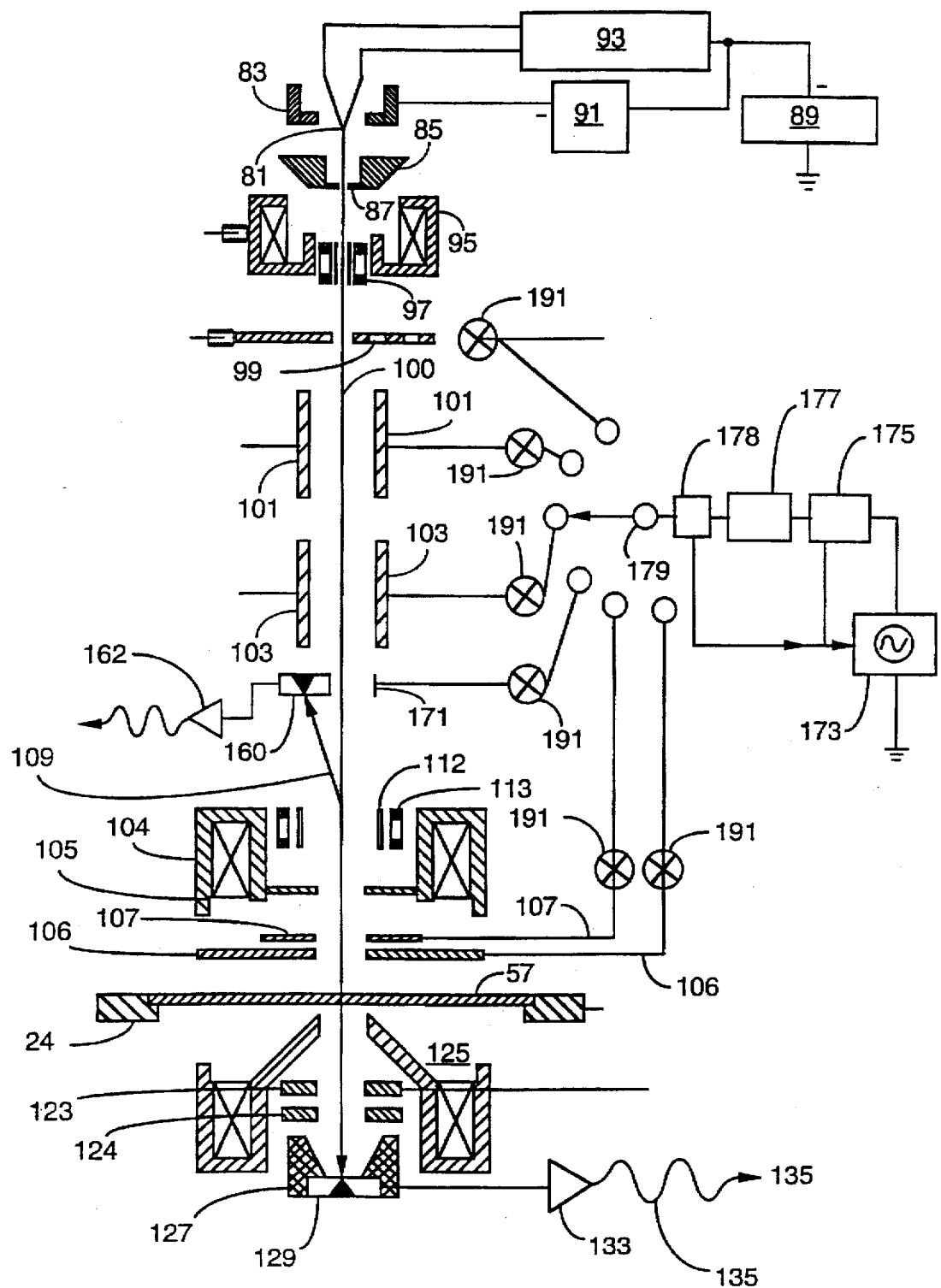
FIG. 12 is a modified schematic representation of the optical column of FIG. 4 to illustrate the electrical components of the plasma oxidizer subsystem of the present invention.

Referring now to FIG. 12, for electrodes requiring deposition removal or any other areas and or elements, all normal electrode path connections are switched through relays 191 to a radio frequency compatible multiplex relay 179 in order to direct RF energy sequentially to each. A generator of high frequency RF power 173 is enabled and then output leveled by power detector 175 and output voltage detector 178. Using an automatic match network 177 (such as an Automatch, registered trademark of RF Plasma Products, Cherry Hill N.J.), leveled RF output power is then transformed to appropriate voltage, current, and phase relation such as to provide both sufficient avalanche potential to initiate a plasma discharge as well as performing conjugate matching of the sustained discharge load.

As shown in FIG. 12 is substrate coating system 172 for applying a conductive coating to the top surface of the substrate to be inspected using the present invention. Any of several well know conductive coating application system can be used including, but not limited to, one that utilizes evaporative or sputtering techniques.

Similarly the plasma may also clean any other surfaces or electrodes, such as 171.

INSPECTION OF PHASE SHIFT MASKS

Figure 13:
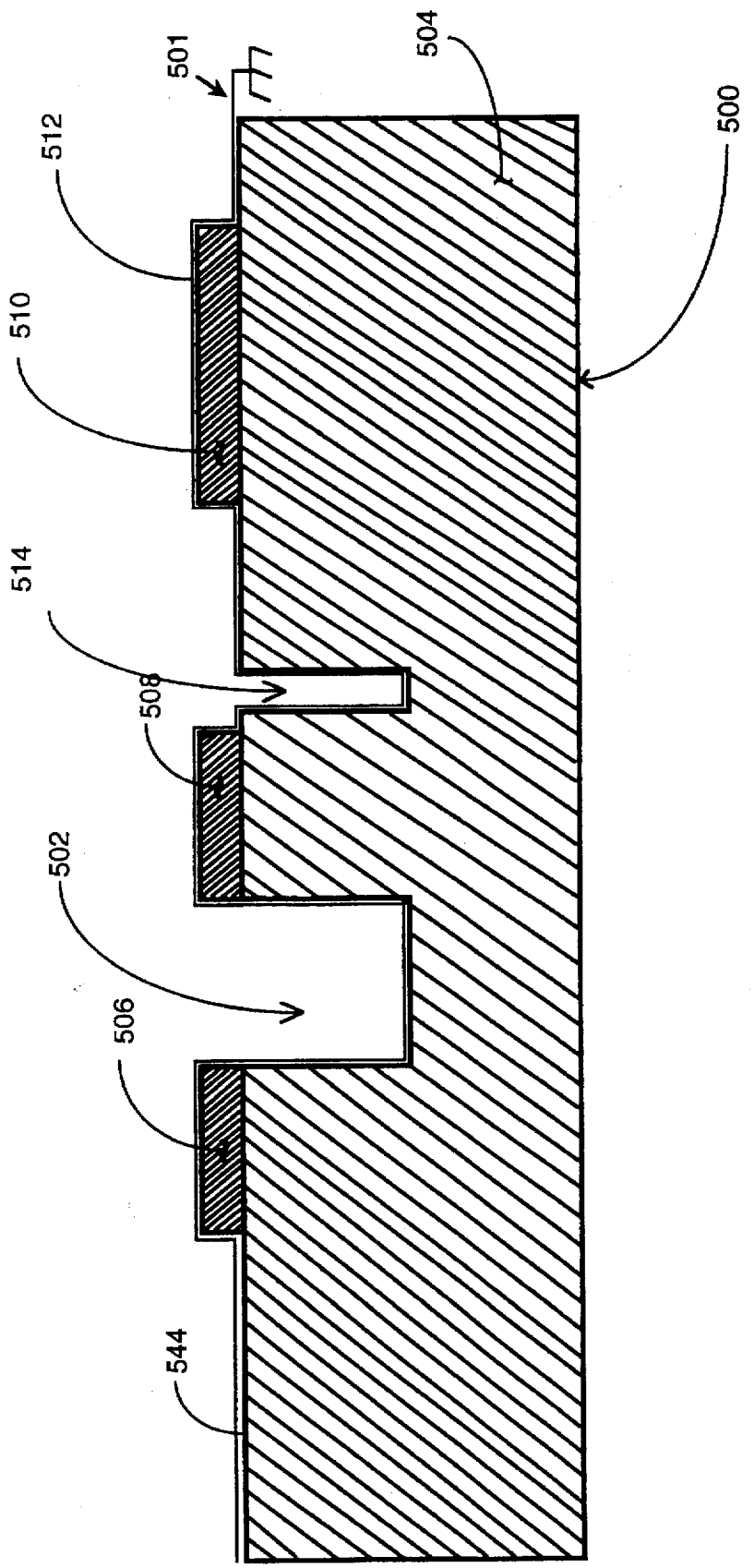
FIG. 13 is a cross-section view of a phase shift mask having a patterned chromium layer on a quartz substrate with phase shift producing well etched into the quartz substrate.

FIG. 13 illustrates the cross section of a typical phase shift mask 500 having an optically transmissive quartz substrate 504 and an opaque patterned chromium layer (typically 0.1 µm thick), shown here as pads 506, 508 and 510, deposited onto the top surface of substrate 504. An optical phase shift, that is desired in the production of a semiconductor wafer using a mask such as phase shift mask 500, is produced by an appropriately sized well or trench 502 (typically ≈25 µm in depth) that is etched into quartz substrate 504 at the desired location.

Phase shift masks, such as mask 500, have always been inspected optically, however, optically techniques are ever more difficult to use as the desired semiconductor surface pattern sizes to be produced by such masks become ever smaller. The present invention uses an electron beam technique that employs the resultant backscatter and secondary electrons to inspect a phase shift mask of any of several variations to determine the surface features of that mask.

To prepare phase shift mask 500 of FIG. 13 for inspection using an electron beam, a thin electrically conductive layer 512 of metal (e.g., aluminum or gold) or of an electrically conducting polymer (e.g. TQV501 manufactured by Nagase Ltd.), is placed on all exposed top surfaces of mask 500 and the structures thereon and therein (with a film coating system of any of a variety of types, including, but not limited to an evaporative coating system or a sputtering system), including wells, by evaporation, or a similar process. Conductive layer 512 is then electrically grounded (501) to provide an electrical return path for the electrons that are not backscattered or produced secondarily, thus minimizing the possibility that an area of the substrate that is under inspection will acquire an electrical charge.

Phase shift mask 500 may contain surface defects that can take various forms, such as extra chromium on, or unwanted etchings into, the quartz, or posts of quartz within a well or extending above surface 544 of the quartz substrate 500. In FIG. 13 a defect in the form of an unwanted etching 514 which is illustrated here as a narrow well adjacent chromium pad 508. However, an unwanted etching may occur anywhere in the surface of quartz substrate 540, including beneath a chromium pad.

Figure 14:
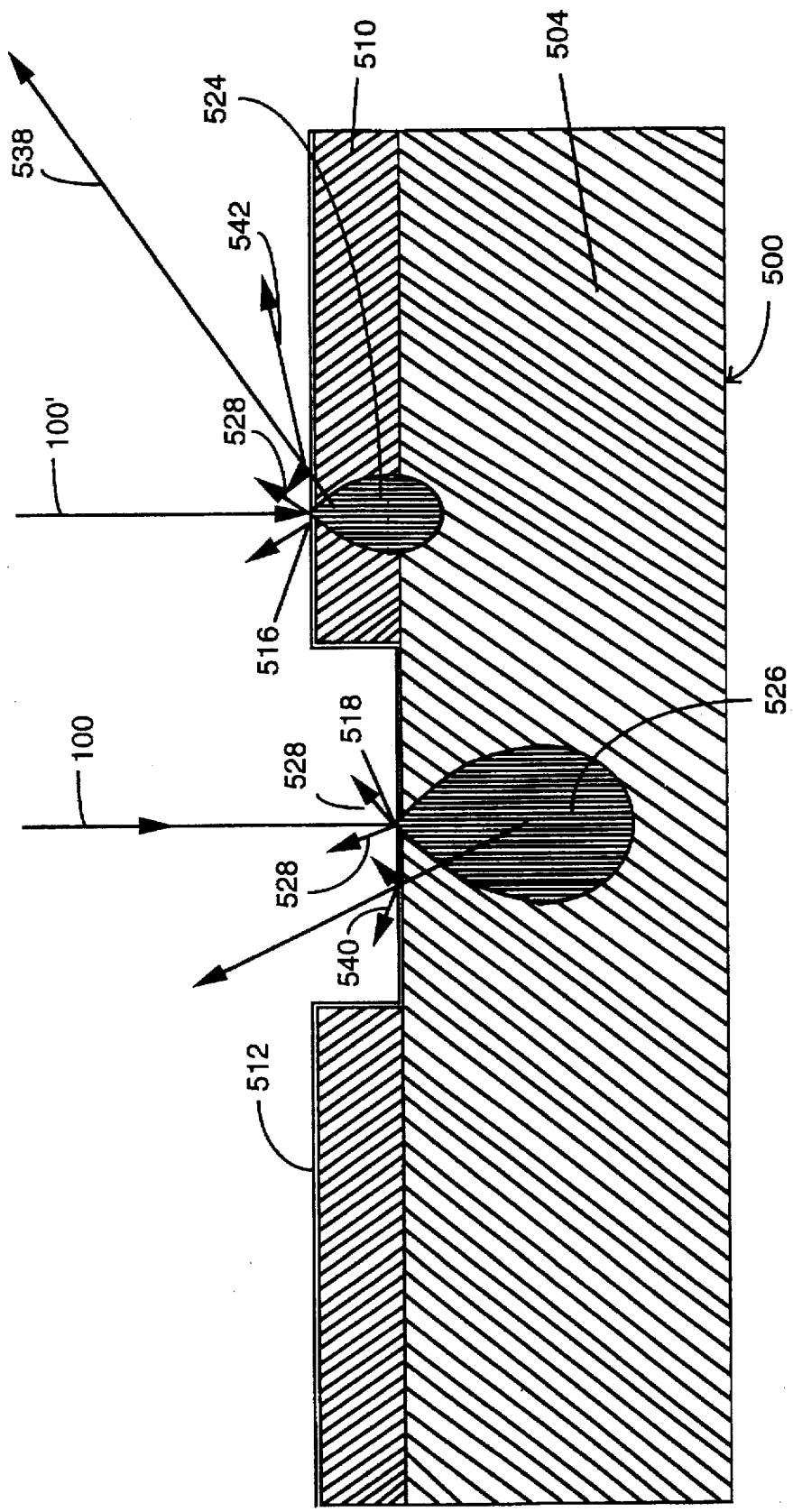
FIG. 14 is a cross-section view of a phase shift mask having a patterned chromium layer on a quartz substrate being bombarded at two locations by an electron beam with tear drop patterns superimposed thereon to illustrate the extent of penetration of the electron beam into quartz and chromium.

Referring now to FIG. 14, there is illustrated one aspect of the present invention wherein the exposure of different surface locations of a simplified phase shift mask 500 and the measurement of the resultant backscatter and secondary electrons from that point enable the user to determine the type of material beneath conductive layer 512 at the location being struck by an electron beam. In FIG. 14, for simplicity of illustration of this aspect of the present invention, substrate 500 is shown being subjected to electron beams 100 and 100' at points 516 and 516', respectively, with only one electron beam being used at any instant in time. To further clarify this point, the electron beam system of the present invention has a single column and thus only one electron beam. The inclusion of two beams in this figure is to illustrate an electron beam being applied substantially perpendicular to two different locations on the surface of the substrate at points 516 and 516' at two different points in time.

Electron beam 100, or 100', typically has a high energy (nominally 20 KV) that penetrates conductive layer 512, as well as, into each of chromium layer 510 and quartz substrate 504, what ever is beneath the point of impact of the electron beam at that point in time. Since chromium has a higher atomic weight than does quartz, electron beam 100' does not penetrate as deeply into chromium layer 510 and quartz substrate 504 as electron beam 100 penetrates into quartz substrate 504 alone, given that the strength of electron beams 100 and 100' are equal. This is representatively illustrated in FIG. 14 by the two different sized teardrop scatter envelopes 524 and 526 at points 516' and 516, respectively, which illustrates the theoretical penetration of the electron beam at each location. At both points, the collision of electrons from electron beam 100, or 100', with thin conductive layer 512 produces secondary electrons 528, commonly referred to as SE I electrons As electron beam 100', or 100 penetrates into either chromium layer 510 or quartz layer 504, respectively, a portion of the colliding electron beam is scattered and produces backscatter electrons 538 or 536, respectively. When backscatter electrons 536 or 538 leave conductive layer 512, they also produce secondary electrons, 540 and 542, respectively, that are commonly referred to as SE II electrons.

Referring now to FIG. 5 where an electron beam column is illustrated, as discussed above, secondary electron detector 117 generates an electrical signal for each secondary electron detected, while backscatter detector 160 similarly generates an electrical signal when a backscatter electron is detected.

Figure 15:
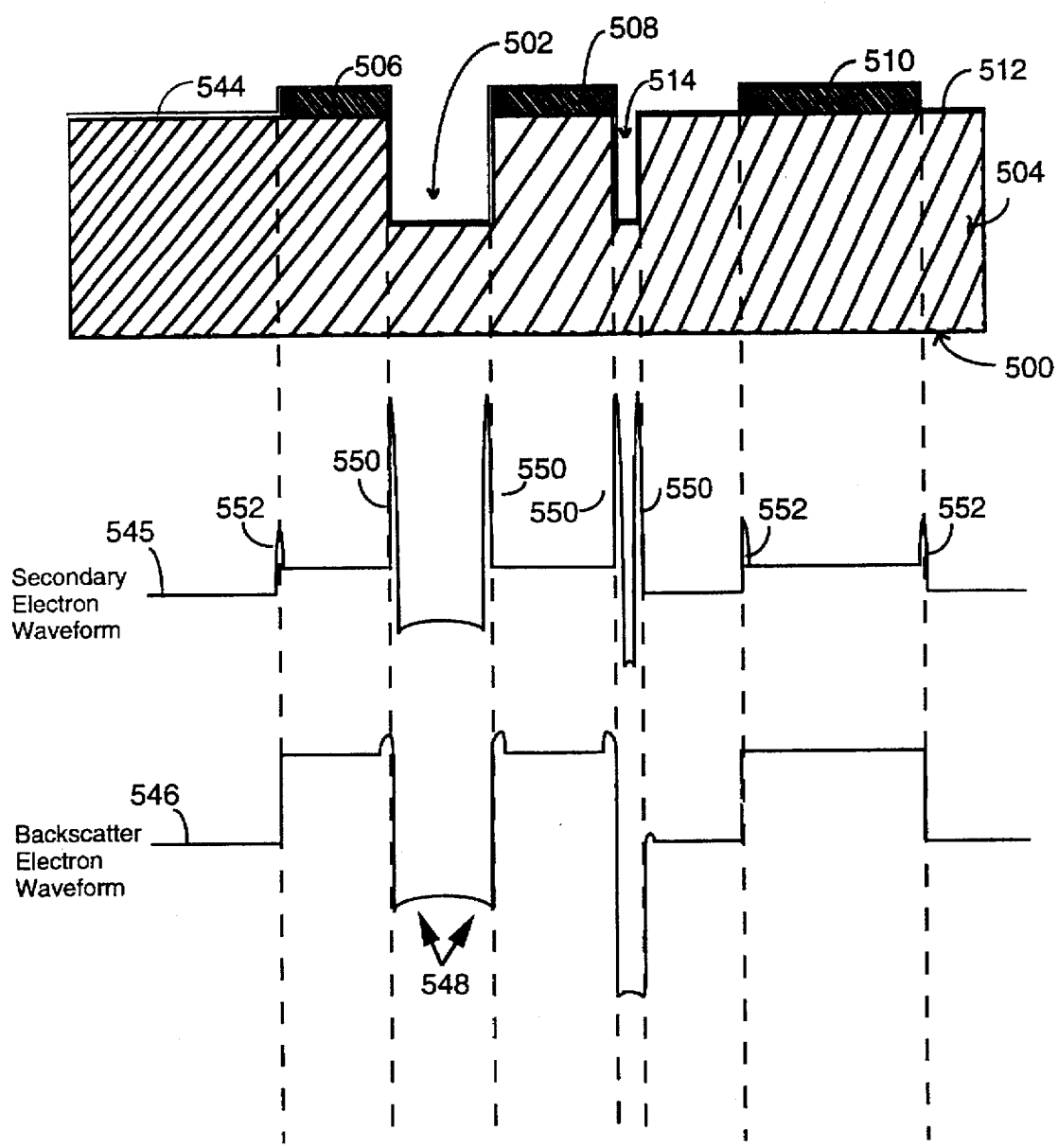
FIG. 15 is a composite drawing of the cross-sectioned mask of FIG. 13 together with the secondary and backscatter electron waveforms aligned with the physical structure of the mask to illustrate which portions of each waveform results from the corresponding physical feature of the mask.

To illustrate the effect of bombarding an optical phase shift mask 500 with a high energy electron beam 100, FIG. 15 combines the cross-sectioned mask 500 of FIG. 13 at the top with the corresponding secondary and backscatter electron waveforms 545 and 546, respectively, produced by bombardment as electron beam 100 traverses across the surface of mask 500. Further, in FIG. 15 secondary and backscatter electron waveforms 545 and 546 are each illustrated in registration with the cross-section of specimen 500 to illustrate the correspondence between those signals and the physical characteristics and surface features of mask 500 as beam 100 scans across the surface of specimen 500. The two signals illustrated are typical of the signals generated by secondary electron detector 117 and backscatter electron detector 160 of FIG. 5, as electron beam 100 scans the surface of specimen 500.

Examining secondary electron waveform 545, several features of the waveform correspond to the physical characteristics of mask 500. In this illustration there are four resulting secondary signal levels: a first signal level that corresponds with those portions of mask 500 that are flat and do not have a chromium structure (544); a second signal level that has a greater magnitude than the first signal level and that corresponds with those portions of mask 500 that have a chromium structure on substrate 504 (506, 508 and 512); a third signal level that has a lower magnitude than the first signal level and that corresponds with the widest well 502; and a fourth signal level that has a signal level that has a lower magnitude than the third signal level and that corresponds to narrow well 514 (the defect in this example). Other physical variations in mask 500 which are not illustrated here could produce other signal level variations, e.g. various thickness of the chromium pads, different widths or depths of wells, quartz posts on the top surface or extending upward within the open space of a well, etc. Other features of secondary electron waveform 545 that are of interest are the sharp signal peaks 550 and 552 at points within the waveform that correspond to transition points in the surface height of mask 500. The most dramatic of these occur at the edges of wells 502 and 514. The larger peaks in the secondary electron waveform result from the production of additional secondary electrons that are emitted from the vertical walls of etched wells 502 and 514. Similarly, the smaller signal peaks 552 result from the production of secondary electrons from the vertical side walls of the patterned chromium pads 506, 508 and 510.

A similar examination of backscatter electron waveform 546 also reveals four backscatter signal levels: a first signal level that corresponds with those portions of mask 500 that are flat and do not have a chromium structure (544); a second signal level that is higher than the first signal level and that corresponds with those portions of mask 500 that have a chromium structure on substrate 504 (506, 508 and 510); a third signal level that is lower than the first signal level and that corresponds with the widest well 502; and a fourth signal level that is lower than the third signal level and that corresponds to narrow well 514 (the defect in this example) with the signal level variations generally being greater in the backscatter waveform. Further, as with the secondary electron waveform, other physical variations in mask 500 will produce other signal level variations, e.g. various thickness of the chromium pads, different widths or depths of wells, quartz posts on the surface and in wells, etc. Additionally, the backscatter electron waveform experiences signal peaking only at the points that correspond to the mask surface transition points to wells. Those transition points to wells correspond to the edges of wells 502 and 514 producing a peak that is much smaller than the peaks in the secondary electron waveform that correspond to the same points on mask 500. Additionally, there are no noticeable peaks at the transitions between the chromium pads (506, 508 and 510) and the plain quartz surface (544).

By comparing each of the secondary and backscatter waveforms, the location, size and shape of any wells can be positively identified. Since the number of backscatter electrons escaping a well is a function of the depth and width of the well, a measure of the depth and width of a well can be determined from backscatter electron waveform 546. In order to do so accurately, a calibration can be made of the backscatter electron waveform against well depth by using a sample of the substrate of interest with known trench depths and widths. Alternately, the same result could be derived by calculating the number of backscatter electrons that can escape from a well of a given depth and width by assuming that the electron emission is lambertian.

Similarly, since secondary electron waveform 545 includes dramatic signal peaks at all points that correspond with surface transitional edges and backscatter electron waveform 546 only experiences peaking at points that correspond to the edges of wells, the backscatter electron waveform can first be examined to identify those points where the signal experiences peaking and thus identify which of the peaks in secondary electron waveform 545 correspond to edges of a well, and then those peaks of secondary electron waveform 545 can be used to positively locate the edges of a well of mask 500.

Further, note the variation in signal levels in secondary electron waveform 545 between the first signal level that corresponds to the nominal flat region 544 of mask 500 and the third signal level that corresponds to well 502 with the first signal level being greater than the third signal level, even though the material of mask 500 is the same at both locations. The difference therefore, is obviously the result of a smaller percentage of secondary electrons being able to escape from the well than are generated from the flat surface. The secondary electron signal emission from the well can thus also be calibrated, to provide a measure of well depth, and this information used, together with the backscatter electron waveform signal level in those regions of mask 500, in a weighted average to determine the depth of wells present in a mask 500.

As noted above, flat surfaces of chromium structures on mask 500 have higher backscatter and secondary electron signal levels than those emitted by similar quartz regions. This results from chromium having a higher atomic weight than quartz, thus, the chromium surfaces generate more backscatter electrons at the surface, which in turn, generates more SE II electrons than are produced at similar quartz surfaces.

Additionally, both the secondary and backscatter electron waveforms 545 and 546 each exhibit, in the regions of the etched wells, an upperwardly curved bow shape in that portion of the waveform (e.g. 548). That characteristic of these waveforms can also be utilized to distinguish etched wells from flat surface areas of the substrate, such as surface 544.

Thus, to detect defects, it is only necessary to perform a region by region examination and comparison of the portions of each of the secondary and backscatter electron waveforms, based on the physical characteristics expected in the substrate of interest, which is then compared with similar results obtained from a corresponding region of the same, or another, mask 500 of the same design. Alternatively, the region by region results obtained from the secondary and backscatter waveforms from an actual mask, as described above, could be compared with results derived from mask data in a data base (e.g. CADS) from which the mask of interest was fabricated. This process can most easily be facilitate by first digitizing the secondary and backscatter electron waveforms 545 and 546, respectfully, and then performing the various functions digitally similar to the process that was described earlier.

Further, after the inspection process is completed, if conductive layer 512 is not transparent to the wavelength of light, or other signal, to be utilized when mask 500 is in the intended application (e.g. printing of the wafer), layer 512 must be removed. To do so, for example, a copper or aluminum layer may be removed from quartz with a KOH solution of approximately 0.34 normal; gold can be removed with KI+I, diluted at 300:1 with water; and polymers can be dissolved with typical organic solvents which do not attack the quartz substrate material.

To obtain the best signal to noise ratio in the secondary and backscatter electron waveforms from the mask of interest, the energy level of electron beam 100 can be varied until acceptable results are obtained. As was observed above, the depth of teardrop scatter envelope 524 (see FIG. 14) in chromium layer 510 approximates the thickness of that chromium layer 510. Also, from a comparison of the signal levels of the secondary and backscatter electron waveforms (see FIG. 15) from a chromium layer versus the quartz substrate alone, it can be seen that the actual variation in signal levels within the backscatter electron waveform is much greater than the variation in signal levels in the secondary electron waveform. It may also be desirable to determine the best energy level to use for the electron beam during the initial set up of the inspection parameters since in many instances the exact characteristics of phase shift mask 500 may not be known a priori. Similarly, different energy levels for the electron beam may facilitate the maximization of the accuracy of depth measurements of wells as compared to determination of the exact location and extent of the patterned chromium fields on the substrate.

To improve the efficiency of capturing the backscatter electrons, one may employ a variety of detectors, such as semiconductor detectors, scintillator-photomultiplier combinations and microchannel plates where the axis of the annulus of the path of detector coincides with the path of the primary beam. These types of detector are discussed in pages 181–182 and 189–190 of a book by Ludwig Reimer: "Scanning Electron Microscopy", Springer-Verlag, Berlin, Heidelberg, New York, Tokyo, 1985.

Figure 16:
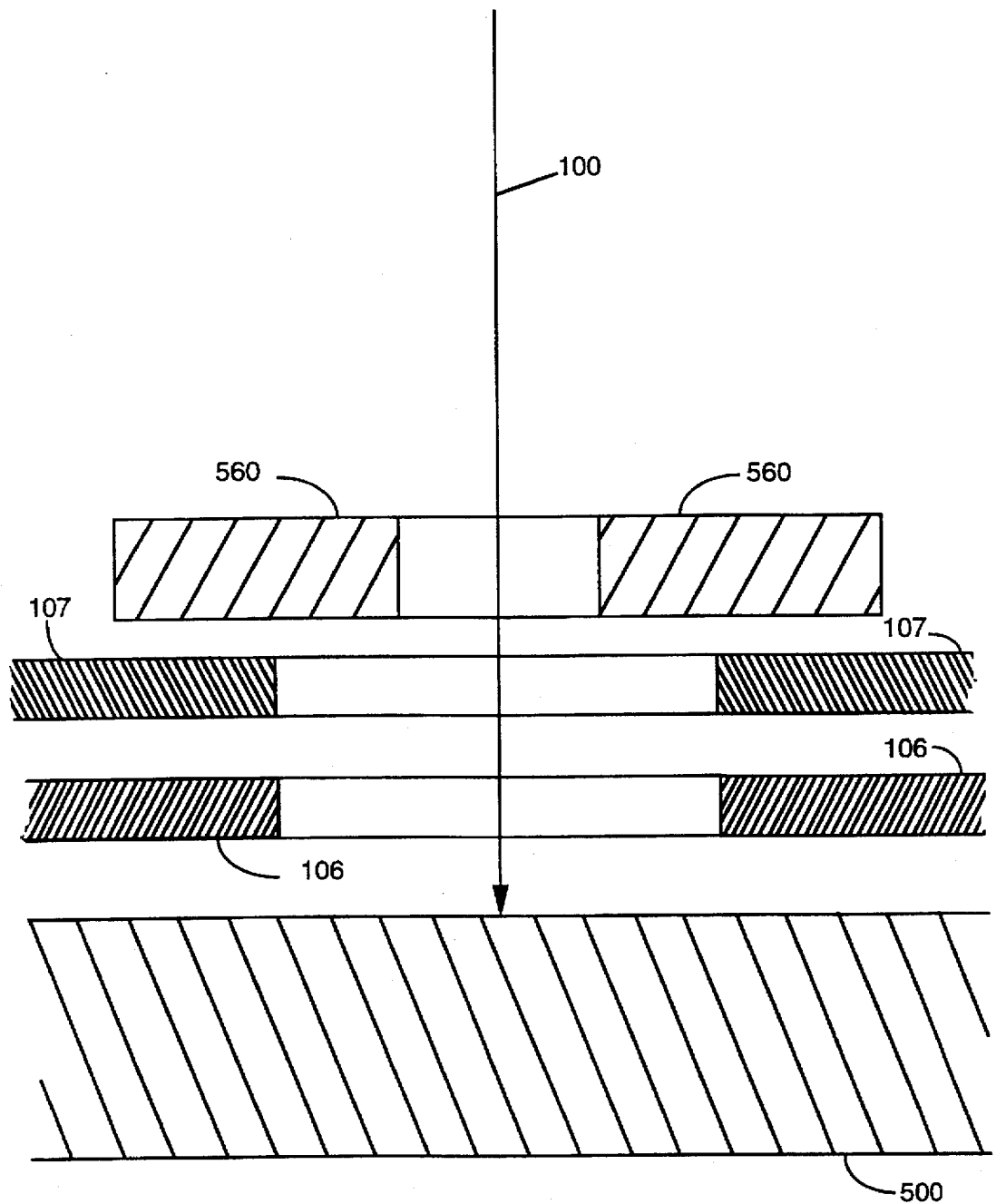
FIG. 16 is a simplified objective lens portion of the electron beam column of FIG. 4 to illustrate one placement of an annular backscatter detector within the column to capture the backscatter electrons of interest from a phase shift mask.

FIG. 16 is a simplified objective lens portion of the electron beam column of FIG. 4 to illustrate one placement of an annular backscatter detector 560 within the column to capture the backscatter electrons of interest from mask 500 for the present invention. As discussed above in relation to FIG. 4, here in FIG. 16 are lower pole piece 106 and intermediate electrode 107 with the backscatter electrons received by annular backscatter detector 560 passing through the central annular openings in lower pole piece 106 and electrode 107.

Figure 17:
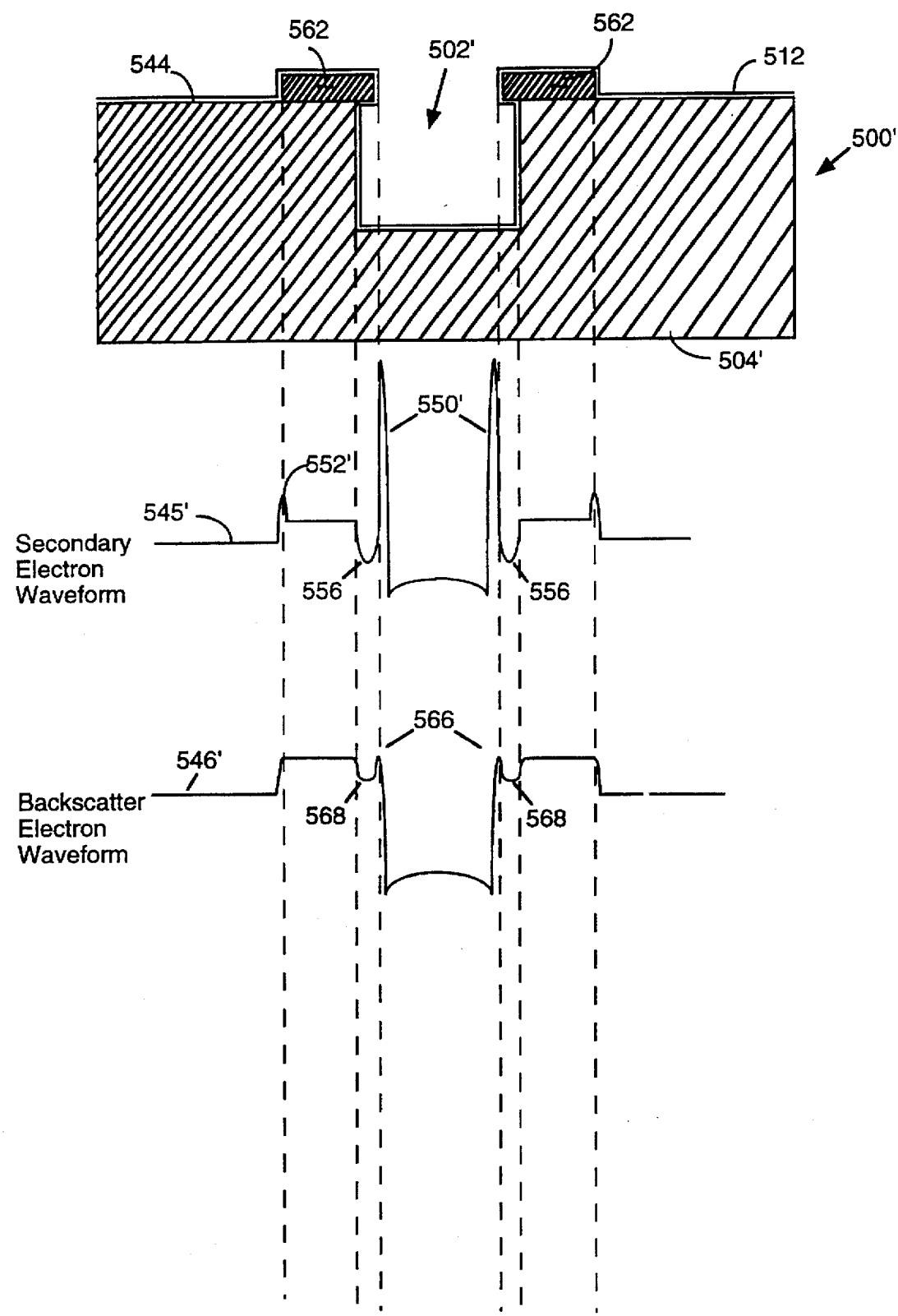
FIG. 17 is a composite drawing of a cross-sectioned mask having a patterned chromium layer that partially overhangs a well in the substrate together with the secondary and backscatter electron waveforms aligned with the physical structure of the mask to illustrate which portions of each waveform results from the corresponding physical feature of the mask.
Figure 18:
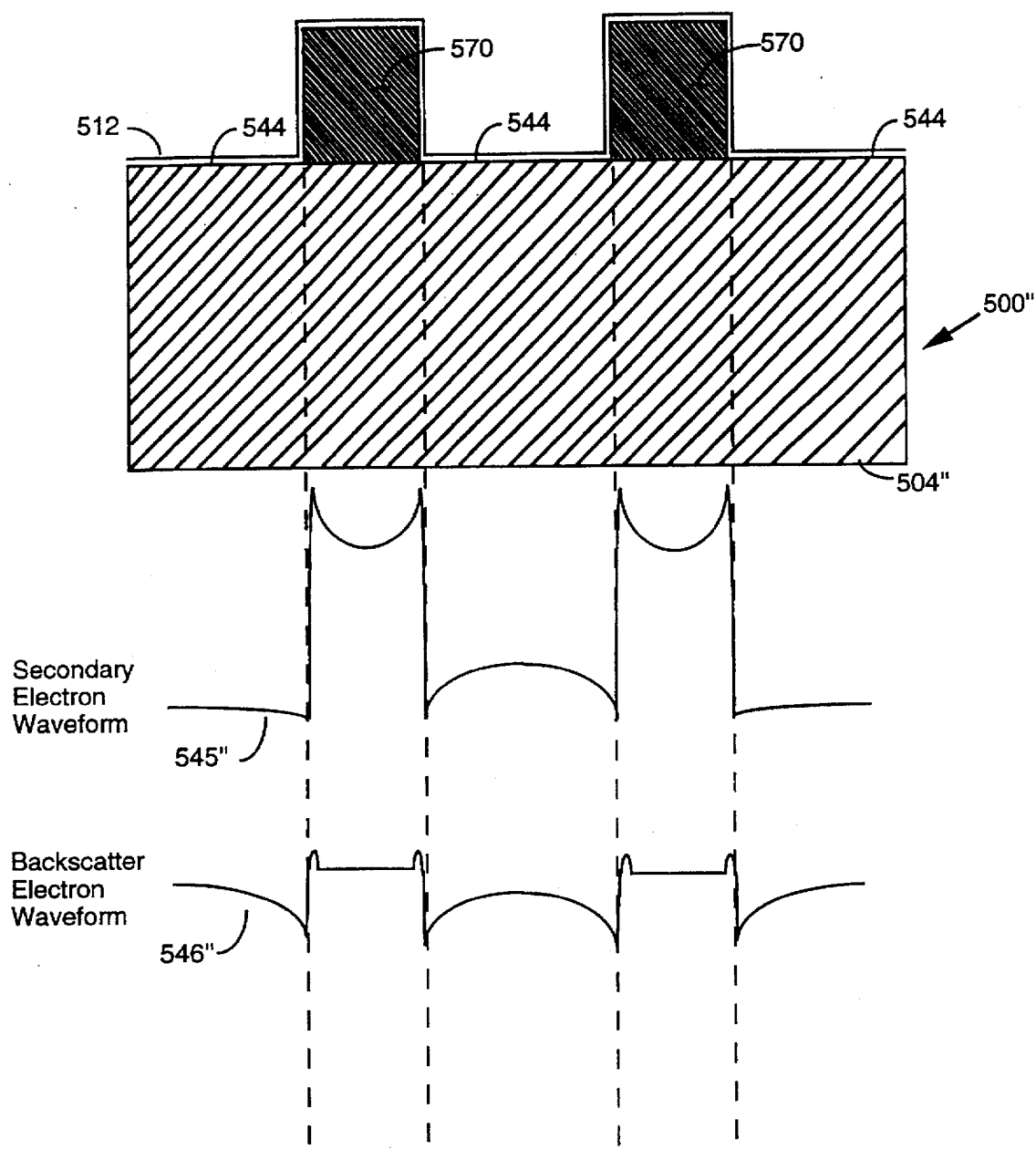
FIG. 18 is a composite drawing of a cross-sectioned mask having a patterned quartz layer on a quartz substrate together with the secondary and backscatter electron waveforms aligned with the physical structure of the mask to illustrate which portions of each waveform results from the corresponding physical feature of the mask.

FIGS. 17 and 18 each illustrate other construction features that are also found on some phase shift masks. At the top of FIG. 17, a cross-section of mask 500' is shown having a quartz substrate 504' and a pair of chromium pads 562 overhanging a well 502' from opposite sides, or chromium pads 562 can be said to be under-cut by well 502'. Additionally, given mask 504' the expected secondary and backscatter electron waveforms 545' and 546', respectfully, are shown below and aligned with the cross-sectioned mask to illustrate the correspondence between the various portions of the waveforms and the features of the mask.

As expected, the shape of the backscatter and secondary electron waveforms for each of the surfaces and the main part of well 502' are as shown previously in FIG. 15. The difference here is the negative going pulse 566 and 568 in the secondary and backscatter electron waveforms 545' and 546', respectfully, in the region of the under-cuts. This small negative pulse at that point in each of the waveforms results from a portion of the electron beam (not shown) penetrating chromium pads 562 and entering well 502' and a lesser number of both backscatter and secondary electrons being produced as compared to the combination of the chromium pad on the quartz substrate. Thus, using the comparison technique discussed above, this additional waveform feature can be used to further identify and distinguish masks that have under-cut chrome pads extending over a well.

Similarly, at the top of FIG. 18, a cross-section of mask 500" is shown having a quartz substrate 504" and on the top surface there are a pair of quartz pads 570 to provide additional phase shifting material. As before, the expected secondary and backscatter electron waveforms 545" and 546", respectfully, for mask 500" are shown below and aligned with the cross-sectioned mask to illustrate the correspondence between the various portions of the waveforms and the features of the mask.

The shape of the backscatter and secondary electron waveforms 545" and 546", respectfully, for each of the surfaces in this configuration of mask 500" show several interesting distinguishing pulse shapes. Overall, as might be expected, there are more backscatter and secondary electrons produced in the region of quartz pads 570 than in the other regions which are represented by surface 544. This basic feature is the result of the additional thickness of the quartz in those regions. Another feature that is shown in each of the secondary and backscatter electron waveforms, is that the signal level for those regions corresponding to surfaces 544 slowly decrease as the region of each of quartz pads 570 is approached from either direction. Similarly, the inverse effect is noted for the region of secondary electron waveform 545" that corresponds to the top of quartz pads 570, namely, the secondary electron waveform is greatest at those points that correspond to the outer edges of quartz pad 570 and slowly decrease toward the center of those regions in either direction. Backscatter electron waveform 546" in the regions that correspond to quartz pads 570 develops small peak values at the points that correspond to the corners of quartz pads 570 and is relatively flat between those small peaks. Additionally, secondary electron waveform 545" has no large narrow pulses, as was the case when a well or a chromium pad was encountered (see FIG. 15). Thus, the comparison technique previously disclosed with respect to FIG. 15, can also distinguish phase shift material from chromium pads and wells, whether or not they are under-cut, and thus is able to detect the presence or absence of wanted or unwanted phase shift material and the size and location of that material from the resultant shapes in various regions of the secondary and backscatter electron waveforms.

As discussed previously, the detection of a defect merely requires the comparison of the signals, or waveforms, from a mask being inspected with the signals from a supposedly identical sample or the calculated signal values from a data base. This comparison can have different tolerance levels, depending on whether the portion of the waveforms obtained at that instant in time is from a chrome layer, from quartz, or other material or from a well. Thus, for example, the waveforms depicted in FIG. 15 can be interpreted to identify the structure of the mask and the characteristics of the surface, by considering various factors of those waveforms. Those factors of the waveforms to be considered to make the desired distinctions include the height of the spikes 550 and 552, and curvatures such as 548 that correspond to, and make it possible to identify, trenches 502 and 514.

That waveform analysis for identifying the different features of a phase shift mask is similar to the automatic analysis of used with electrocardiograms, which has been an area of considerable research in the past (See G. C. Stockman: "A Problem-Reduction Approach to Linguistic Analysis of Waveforms", Ph.D. Dissertation, Univ. of Maryland, Department of Computer Science, May 1977). This type of pattern recognition appears in the literature of syntactic pattern recognition with the parsing of a sample by features, such as peaks and valleys.

Thus, when applied to phase shift masks, the bottom of the wells, or trenches, are distinguishable by a combination of waveform features, including the upward curvature of the secondary and backscatter electron waveforms at one of the lower signal levels and signal spikes in the secondary electron waveform on both sides of the trench. The detection of that signal curvature corresponding to the bottom of wells, or for any other feature such as quartz on quartz (see FIG. 18) can be performed by the method presented in Chapter 10, "Two-Dimensional Shape Representation" by Larry S. Davis, pp 233–245 of *Handbook of Pattern Recognition and Image Processing*, Academic Press, Inc., San Diego, Calif., 1986.

Additionally, each of the signal processing methods discussed in each of the last two references cited, may be used to assign different detection tolerances in the comparisons depending on the features of the mask, as well as being usable in combination with the detected of other distinguishing features to make a positive determination of the structure of a mask.

While this invention has been described in several modes of operation and with exemplary routines and apparatus, it is contemplated that persons skilled in the art, upon reading the preceding descriptions and studying the drawings, will realize various alternative approaches to the implementation of the present invention. It is therefore intended that the following appended claims be interpreted as including all such alterations and modifications that fall within the true spirit and scope to the present invention and the appended claims.

In summary, the present invention relies on making the top surface of the mask to be inspected electrically conductive, and on the analysis of the secondary and backscatter electron waveforms created by the topology and differences in atomic weight of the various structures of the mask.

One may achieve electrical conduction along the top surface of the mask in ways other than coating of the finished mask as illustrated and discussed above with relation to the various figures. Another technique would be to place a conductive, transparent coating, such as Indium tin oxide on the top surface of the quartz substrate before the patterned chromium layer is deposited on the substrate. If that technique is used, the conductive transparent coating between the patterned chromium layer pads would not have to be removed prior to use of the phase shift mask for the intended purpose since the conductive layer is transparent. Alternately, the quartz substrate could be made conductive by ion implantation. An advantage of permanently making the quartz substrate conductive is that it facilitates ion beam repair of the mask and precludes damage due to static electrical discharge in normal use.

Further, the inspection technique of the present invention is not limited to use with phase shift masks that perform a phase shift that is determined by the etched pattern of the quartz substrate. A phase shift mask was used in the above discussions of the present invention for convenience since it permitted discussion of various mask patterns, illustrated the versatility of techniques that one would use for inspection of various mask configurations and the completeness of the inspection based only on the secondary and backscatter electron waveforms created in an electron beam inspection environment.

The techniques of the present invention provide for the inspection of many different types of optical masks. For example, any superimposed material, such as spin-on glass can also be distinguished from the substrate or the chromium and will produce secondary and backscatter electron waveforms that make it possible to determine the thickness of the spin-on glass layer. Further, attenuating phase shift masks, such as those that include leaky chromium, or other attenuating material, can also be inspected with the techniques of the present invention as discussed above. Similarly, it is easy to see that the present invention also provides a method for inspecting optical proximity masks.

What is claimed is:

1. A system to automatically inspect an optical mask, said system comprising:

film coating system to apply a conductive coating to a top surface of said optical mask to produce a conductive optical mask;

a grounding strap to connect said conductive coating of said conductive optical mask to electrical ground;

a field emission electron source to provide an electron beam;

a charged particle beam column to deliver and scan said electron beam from said field emission electron source on a top surface of said conductive coating;

a backscatter electron detector to detect backscattered electrons from said conductive optical mask to generate a backscatter electron waveform as said electron beam scans said conductive optical mask;

a secondary electron detector to detect secondary electrons from said conductive optical mask to generate a secondary electron waveform as said electron beam scans said conductive coating; and a processor to examine said backscatter electron waveform and said secondary electron waveform to determine construction features of said conductive optical mask.

2. A system to automatically inspect an optical mask as in claim 1 wherein said optical mask is a phase shift mask.

3. A system to automatically inspect an optical mask as in claim 1 wherein said film coating system is a sputtering system.

4. A system to automatically inspect an optical mask as in claim 1 further comprising a memory connected to each of said backscatter electron detector and said secondary electron detector to store said backscatter electron waveform and said secondary electron waveform from said conductive optical mask.

5. A method for automatically inspecting an optical mask, said method comprising the steps of:

a. applying a conductive coating to a top surface of said optical mask to produce a conductive optical mask;

b. electrically grounding said conductive coating;

c. scanning an electron beam on a top surface of said conductive coating of step b.;

d. detecting backscattered electrons from said conductive coating of step c. to form a backscatter electron waveform;

e. detecting secondary electrons from said conductive coating of step c. to form a secondary electron waveform;

f. examining said backscatter electron waveform and said secondary electron waveform from steps d, and e.; and g. determining construction features of said conductive optical mask in response to step f.

6. A method for automatically inspecting an optical mask as in claim 5 wherein said optical mask is a phase shift mask.

7. A method for automatically inspecting an optical mask as in claim 5 wherein step a further includes the step of:

h. sputtering said coating onto said optical mask.

8. A method for automatically inspecting an optical mask as in claim 5 further including the step of:

i. storing each of said backscatter electron waveform from step d. and said secondary electron waveform from step e.

\* \* \* \* \*